United States Patent
Lee et al.

(10) Patent No.: US 9,831,138 B2
(45) Date of Patent: Nov. 28, 2017

(54) DISPLAY SUBSTRATE, METHOD OF TESTING THE DISPLAY SUBSTRATE AND DISPLAY APPARATUS HAVING THE DISPLAY SUBSTRATE

(71) Applicant: Samsung Display Co., LTD., Yongin, Gyeonggi-Do (KR)

(72) Inventors: Hong-Beom Lee, Hwaseong-si (KR); Sang-Hyun Kang, Yongin-si (KR); Soo-Chul Kim, Gwangmyeong-si (KR); Hong-Joon Moon, Cheonan-si (KR); Jun-Seok Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 658 days.

(21) Appl. No.: 14/290,064

(22) Filed: May 29, 2014

(65) Prior Publication Data
US 2015/0194357 A1 Jul. 9, 2015

(30) Foreign Application Priority Data
Jan. 9, 2014 (KR) ........................ 10-2014-0002941

(51) Int. Cl.
*H01L 21/66* (2006.01)
*G01R 31/26* (2014.01)
(Continued)

(52) U.S. Cl.
CPC ............ *H01L 22/32* (2013.01); *G09G 3/006* (2013.01); *G09G 3/3614* (2013.01); *G09G 2300/0426* (2013.01)

(58) Field of Classification Search
CPC .... G09G 3/006; G01R 31/26; G01R 31/3004; G01R 31/3008; G01R 31/2884;
(Continued)

(56) References Cited

U.S. PATENT DOCUMENTS

| | | | |
|---|---|---|---|
| 7,791,078 B2* | 9/2010 | Kim ................... | G02F 1/13624 257/59 |
| 8,223,108 B2* | 7/2012 | Chang ................... | G09G 3/006 345/100 |

(Continued)

FOREIGN PATENT DOCUMENTS

| | | |
|---|---|---|
| KR | 1020000032794 A | 6/2000 |
| KR | 1020030053186 A | 6/2003 |

(Continued)

*Primary Examiner* — Jermele M Hollington
*Assistant Examiner* — Suresh K Rajaputra
(74) *Attorney, Agent, or Firm* — Cantor Colburn LLP

(57) ABSTRACT

A display substrate includes a first gate line configured to receive a first gate clock, a second gate line adjacent to the first gate line and configured to receive a second gate clock, a first data line configured to transfer a first data signal inverted according to the first gate clock and the second gate clock, where the first data signal has a first polarity, a second data line configured to transfer a second data signal inverted according to the first gate clock and the second gate clock, where the second data signal has a second polarity different from the first polarity, a first pixel including a first high sub pixel electrically connected to the first gate line and the first data line, and a first low sub pixel electrically connected to the first gate line and the second data line.

20 Claims, 17 Drawing Sheets

(51) Int. Cl.
*H01L 27/12* (2006.01)
*G09G 3/00* (2006.01)
*G09G 3/36* (2006.01)

(58) Field of Classification Search
CPC ............ G01R 31/31924; H05K 999/99; H01L 2924/01079; H01L 2924/14; H01L 27/124; H01L 22/32; H01L 21/66; H01L 27/12; H01L 22/34
See application file for complete search history.

(56) References Cited

U.S. PATENT DOCUMENTS

| | | | | |
|---|---|---|---|---|
| 8,723,901 | B2* | 5/2014 | Kim | G02F 1/1343 345/691 |
| 2002/0140650 | A1* | 10/2002 | Kai | G09G 3/3688 345/87 |
| 2003/0071943 | A1* | 4/2003 | Choo | G02F 1/133514 349/106 |
| 2006/0097971 | A1* | 5/2006 | Lee | G09G 3/3648 345/89 |
| 2006/0180813 | A1* | 8/2006 | Kim | G09G 3/3648 257/59 |
| 2007/0008263 | A1* | 1/2007 | Kim | G02F 1/134336 345/87 |
| 2009/0174692 | A1* | 7/2009 | Park | G09G 3/3648 345/204 |
| 2010/0225831 | A1* | 9/2010 | Takeuchi | G02F 1/136213 348/739 |
| 2011/0025923 | A1* | 2/2011 | Tsubata | G02F 1/136213 348/731 |
| 2012/0001839 | A1* | 1/2012 | Tsubata | G02F 1/134309 345/90 |
| 2013/0147698 | A1* | 6/2013 | Kang | G09G 3/3674 345/88 |
| 2013/0235026 | A1* | 9/2013 | Yamamoto | G11C 19/184 345/214 |

FOREIGN PATENT DOCUMENTS

| | | |
|---|---|---|
| KR | 1020050053407 A | 6/2005 |
| KR | 1020070072962 A | 7/2007 |
| KR | 1020130050723 A | 5/2013 |

* cited by examiner

DISPLAY SUBSTRATE, METHOD OF TESTING THE DISPLAY SUBSTRATE AND DISPLAY APPARATUS HAVING THE DISPLAY SUBSTRATE

This application claims priority to Korean Patent Application No. 10-2014-0002941, filed on Jan. 9, 2014, and all the benefits accruing therefrom under 35 U.S.C. §119, the content of which in its entirety is herein incorporated by reference.

BACKGROUND

1. Field

Exemplary embodiments of the invention relate to a display substrate, a method of testing the display substrate and a display apparatus including the display substrate. More particularly, exemplary embodiments of the invention relate to a display substrate on which a test pad is provided, a method of testing the display substrate and a display apparatus including the display substrate.

2. Description of the Related Art

A display substrate of a display apparatus, such as a liquid crystal display apparatus, includes a plurality of pixels. The pixels are typically disposed in a matrix form, and each of the pixels is electrically connected to a gate line and a data line.

Each of the pixels may include a first sub pixel and a second sub pixel. For example, a first pixel of the pixels may include the first sub pixel and the second sub pixel, and a second pixel of the pixels, which is adjacent to the first pixel, may include the first sub pixel and the second sub pixel. Data signals having different polarities may be respectively charged to the first sub pixel and the second sub pixel.

In such a display substrate where the data signals having the different polarities are respectively charged to the second sub pixel of the first pixel and the first sub pixel of the second pixel, a data voltage of the second sub pixel in the first pixel and the first sub pixel in the second pixel becomes a reference voltage (e.g., about zero volt), defining the polarities of the data signals, when a short between the first pixel and the second pixel occurs, such that short between the first pixel and the second pixel may be effectively detected based on whether the data voltage of the second sub pixel in the first pixel and the first sub pixel in the second pixel is the reference voltage (e.g., about zero volt) or not.

However, when data signals having the same polarities are respectively charged to the second sub pixel of the first pixel and the first sub pixel of the second pixel, the data voltage at a point where the second sub pixel in the first pixel and the first sub pixel in the second pixel are short is not the reference voltage or about zero, such that the short between the first pixel and the second pixel may not be effectively detected based on whether the data voltage of the second sub pixel in the first pixel and the first sub pixel in the second pixel is the reference voltage (e.g., about zero volt) or not.

SUMMARY

Exemplary embodiments of the invention provide a display substrate with improved or increased defect detection ratio of the display substrate.

Exemplary embodiments of the invention also provide a method of testing the above-mentioned display substrate.

Exemplary embodiments of the invention also provide a display apparatus including the above-mentioned display substrate.

According to an exemplary embodiment of the invention, a display substrate includes a first gate line, a second gate line, a first data line, a second data line, a first pixel, a second pixel, a first pad and a second pad. In such an embodiment, the first gate line is configured to receive a first gate clock, the second gate line is adjacent to the first gate line and is configured to receive a second gate clock, the first data line is configured to transfer a first data signal inverted according to the first gate clock and the second gate clock, the first data signal has a first polarity, the second data line is configured to transfer a second data signal inverted according to the first gate clock and the second gate clock, and the second data signal has a second polarity different from the first polarity. In such an embodiment, the first pixel includes a first high sub pixel electrically connected to the first gate line and the first data line, and a first low sub pixel electrically connected to the first gate line and the second data line, and the second pixel includes a second high sub pixel electrically connected to the second gate line and the second data line, and a second low sub pixel electrically connected to the second gate line and the first data line. In such an embodiment, the first pad is configured to output the first gate clock to the first gate line, and the second pad is configured to output the second gate clock to the second gate line.

In an exemplary embodiment, when the first pad outputs the first gate clock, the first data signal may have a positive polarity and the second data signal may have a negative polarity, and when the second pad outputs the second gate clock, the first data signal may have the negative polarity and the second data signal may have the positive polarity.

In an exemplary embodiment, when the first pad outputs the first gate clock, the first data signal may have a negative polarity and the second data signal may have a positive polarity, and when the second pad outputs the second gate clock, the first data signal may have the positive polarity and the second data signal may have the negative polarity.

In an exemplary embodiment, the second gate clock may be activated after the first gate clock is activated and deactivated.

In an exemplary embodiment, the display substrate may further include a third gate line and a third pixel. In such an embodiment, the third gate line may be adjacent to the second gate line and may be configured to receive the first gate clock, and the third pixel may include a third high sub pixel electrically connected to the third gate line and the first data line, and a third low pixel electrically connected to the third gate line and the second data line.

In an exemplary embodiment, the display substrate may further include a third pad configured to output the first gate clock to the third gate line.

In an exemplary embodiment, the first pad and the third pad may be electrically connected to each other.

In an exemplary embodiment, the first pad may be configured to further output the first gate clock to the third gate line.

In an exemplary embodiment, the display substrate may further include a fourth gate line, a fourth pixel and a fourth pad. In such an embodiment, the fourth gate line may be adjacent to the third gate line and may be configured to receive the second gate clock, the fourth pixel may include a fourth high sub pixel electrically connected to the fourth gate line and the second data line, and a fourth low sub pixel electrically connected to the fourth gate line and the first data line, and the fourth pad may be configured to output the second gate clock to the fourth gate line.

In an exemplary embodiment, the second gate clock may include a positive second gate clock and a negative second gate clock, the second pad may be configured to output the positive second gate clock and the fourth pad may be configured to output the negative second gate clock.

In an exemplary embodiment, the display substrate may further include a fifth gate line, a fifth pixel and a fifth pad. In such an embodiment, the fifth gate line may be adjacent to the fourth gate line and may be configured to receive the first gate clock, the fifth pixel may include a fifth high sub pixel electrically connected to the fifth gate line and the first data line, and a fifth low sub pixel electrically connected to the fifth gate line and the second data line, and the fifth pad may be configured to output the first gate clock to the fifth gate line.

In an exemplary embodiment, the first gate clock may include a positive first gate clock and a negative first gate clock, the first pad may be configured to output the positive first gate clock, and the fifth pad may be configured to output the negative second gate clock.

In an exemplary embodiment, the display substrate may further include a sixth gate line and a sixth pixel. In such an embodiment, the sixth gate line may be adjacent to the fifth gate line and may be configured to receive the second gate clock, and the sixth pixel may include a sixth high sub pixel electrically connected to the sixth gate line and the second data line, and a sixth low sub pixel electrically connected to the sixth gate line and the first data line.

In an exemplary embodiment, the display substrate may further include a sixth pad may be configured to output the second gate clock to the sixth gate line.

In an exemplary embodiment, the fourth pad and the sixth pad may be electrically connected to each other.

In an exemplary embodiment, the fourth pad may be configured to further output the second gate clock to the sixth gate line.

According to an exemplary embodiment of the invention, a method of testing a display substrate includes: applying a first gate clock to a first gate line of the display substrate, where the display substrate includes the first gate line configured to receive the first gate clock, a second gate line adjacent to the first gate line and configured to receive a second gate clock, a first data line configured to transfer a first data signal inverted according to the first gate clock and the second gate clock, a second data line configured to transfer a second data signal inverted according to the first gate clock and the second gate clock, a first pixel including a first high sub pixel electrically connected to the first gate line and the first data line and a first low sub pixel electrically connected to the first gate line and the second data line, and a second pixel including a second high sub pixel electrically connected to the second gate line and the second data line and a second low sub pixel electrically connected to the second gate line and the first data line; applying the first data signal and the second data signal to the first data line and the second data line, applying the second gate clock to the second gate line, respectively; applying the first data signal and the second data signal to the first data line and the second data line; and determining whether the first pixel and the second pixel are short respectively, in which the first data signal has a first polarity, and the second data signal has a second polarity different from the first polarity.

In an exemplary embodiment, the first gate clock may include a positive first gate clock and a negative first gate clock.

In an exemplary embodiment, the second gate clock may include a positive second gate clock and a negative second gate clock.

According to an exemplary embodiment of the invention, a display apparatus includes a display substrate, a gate driving part and a data driving part. In such an embodiment, the display substrate includes a first gate line configured to receive a first gate clock, a second gate line adjacent to the first gate line and configured to receive a second gate clock, a first data line configured to transfer a first data signal inverted according to the first gate clock and the second gate clock, a second data line configured to transfer a second data signal inverted according to the first gate clock and the second gate clock, a first pixel including a first high sub pixel electrically connected to the first gate line and the first data line and a first low sub pixel electrically connected to the first gate line and the second data line, a second pixel including a second high sub pixel electrically connected to the second gate line and the second data line and a second low sub pixel electrically connected to the second gate line and the first data line, a first pad configured to output the first gate clock to the first gate line, and a second pad configured to output the second gate clock to the second gate line, where the first data signal has a first polarity, and the second data signal has a second polarity different from the first polarity. In such an embodiment, the gate driving part is configured to output gate signals to the first gate line and the second gate line, and the data driving part is configured to respectively output the first data signal and the second data signal to the first data line and the second data line.

According to exemplary embodiments of the invention, when test signals are applied to the pixels, polarities of high sub pixels adjacent in a first direction are different from each other, polarities of low sub pixels adjacent in the first direction are different from each other, and polarities of the low sub pixel and the high sub pixel adjacent in the second direction are different from each other, such that a short between the pixels may be effectively detected based on detecting a point having the reference voltage in adjacent pixels. Thus, defect detection ratio of the display substrate may be increased.

BRIEF DESCRIPTION OF THE DRAWINGS

The above and other features of the invention will become more apparent by describing in detailed example embodiments thereof with reference to the accompanying drawings, in which.

DETAILED DESCRIPTION

Figure 1A:
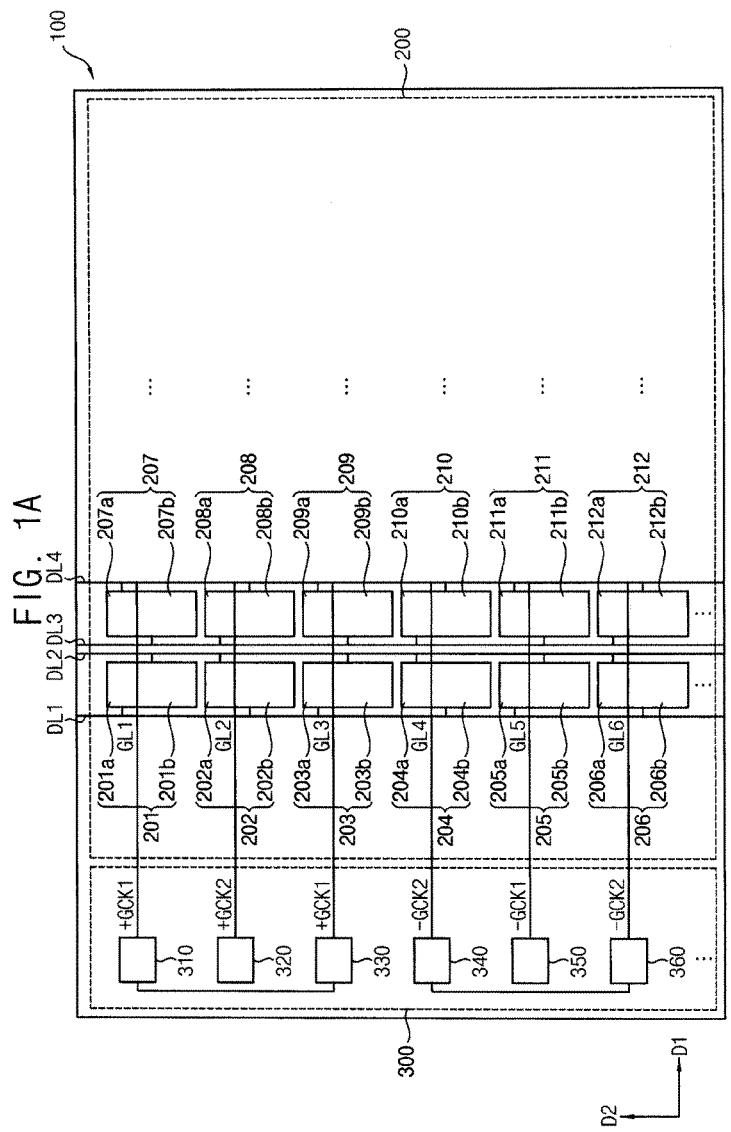
FIG. 1A is a plan view illustrating an exemplary embodiment of a display substrate according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

Figure 1B:
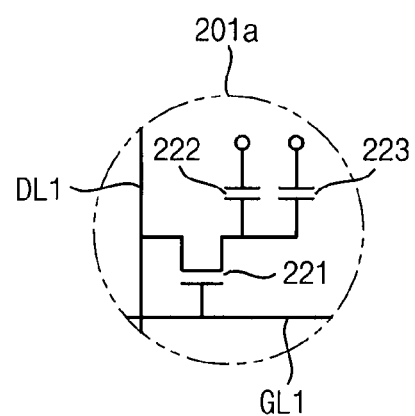
FIGS. 1B and 1C are circuit diagrams showing sub-pixels of a pixel of the display substrate shown in FIG. 1A.
Figure 1C:
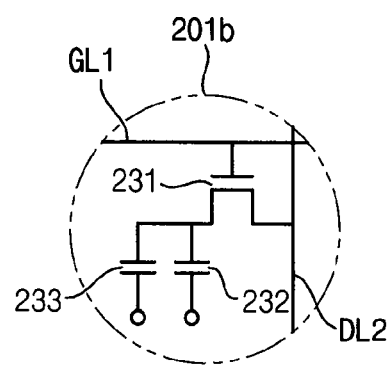

FIG. 1A is a plan view illustrating an exemplary embodiment of a display substrate according to the invention, and FIGS. 1B and 1C are circuit diagrams showing sub-pixels of a pixel of the display substrate shown in FIG. 1A.

Referring to FIG. 1A, an exemplary embodiment of the display substrate 100 includes an array portion 200 and a pad portion 300.

The array portion 200 includes gate lines, data lines and a plurality of pixels disposed substantially in a matrix form. In one exemplary embodiment, for example, the array portion 200 may include first gate line GL1, a second gate line GL2, a third gate line GL3, a fourth gate line GL4, a fifth gate line GL5 and a sixth gate line GL6. In such an embodiment, the array portion 200 may include a first data line DL1, a second data line DL2, a third data line DL3 and a fourth data line DL4. In such an embodiment, the array portion 200 may include a first pixel 201, a second pixel 202, a third pixel 203, a fourth pixel 204, a fifth pixel 205, a sixth pixel 206, a seventh pixel 207, an eighth pixel 208, a ninth pixel 209, a tenth pixel 210, an eleventh pixel 211 and a twelfth pixel 212.

The first to sixth gate lines GL1, GL2, . . . , GL6 extend substantially in a first direction D1. The first to fourth data lines DL1, DL2, . . . , DL4 extend substantially in a second direction, which is perpendicular to the first direction D1. The first data line DL1 transfers a first data signal, the second data line DL2 transfers a second data signal, the third data line DL3 transfers a third data signal, and the fourth data line DL4 transfers a fourth data signal. In an exemplary embodiment, polarities of data signals applied to adjacent data lines are different from each other. In such an embodiment, a polarity of the first data signal and a polarity of the second data signal is different from each other, the polarity of the second data signal and a polarity of the third data signal is different from each other, and the polarity of the third data signal and a polarity of the fourth data signal is different from each other. The second data line DL2 and the third data line DL3 are disposed between the first pixel 201 and the seventh pixel 207, between the second pixel 202 and the eighth pixel 208, between the third pixel 203 and the ninth pixel 209, between the fourth pixel 204 and the tenth pixel 210, between the fifth pixel 205 and the eleventh pixel 211, and between the sixth pixel 206 and the twelfth pixel 212. The first direction D1 may be substantially parallel to a long side of the display substrate 100, and the second direction D2 may be substantially parallel to a short side of the display substrate 100.

The first pixel 201 includes a first high sub pixel 201a and a first low sub pixel 201b. The first high sub pixel 201a is electrically connected to the first gate line GL1 and the first data line DL1. In such an embodiment, as shown in FIG. 1B, the first high sub pixel 201a includes a first thin film transistor 221 electrically connected to the first gate line GL1 and the first data line DL1, a first liquid crystal capacitor 222 and a first storage capacitor 223, which are electrically connected to the first thin film transistor 221. The first low sub pixel 201b is electrically connected to the first gate line GL1 and the second data line DL2. In such an embodiment, as shown in FIG. 1C, the first low sub pixel 201b includes a second thin film transistor 231 electrically connected to the first gate line GL1 and the second data line DL2, a second liquid crystal capacitor 232 and a second storage capacitor 233, which are electrically connected to the second thin film transistor 231.

The second pixel 202 includes a second high sub pixel 202a and a second low sub pixel 202b. The second high sub pixel 202a is electrically connected to the second gate line GL2 and the second data line DL2. A structure of the second high sub pixel 202a is substantially the same as a structure of the first high sub pixel 201a. The second low sub pixel 202b is electrically connected to the second gate line GL2 and the first data line DL1. A structure of the second low sub pixel 202b is substantially the same as a structure of the first low sub pixel 201b.

The third pixel 203 includes a third high sub pixel 203a and a third low sub pixel 203b. The third high sub pixel 203a is electrically connected to the third gate line GL3 and the first data line DL1. A structure of the third high sub pixel 203a is substantially the same as the structure of the first high sub pixel 201a. The third low sub pixel 203b is electrically connected to the third gate line GL3 and the second data line DL2. A structure of the third low sub pixel 203b is substantially the same as the structure of the first low sub pixel 201b.

The fourth pixel 204 includes a fourth high sub pixel 204a and a fourth low sub pixel 204b. The fourth high sub pixel 204a is electrically connected to the fourth gate line GL4 and the second data line DL2. A structure of the fourth high sub pixel 204a is substantially the same as the structure of the first high sub pixel 201a. The fourth low sub pixel 204b is electrically connected to the fourth gate line GL4 and the first data line DL1. A structure of the fourth low sub pixel 204b is substantially the same as the structure of the first low sub pixel 201b.

The fifth pixel 205 includes a fifth high sub pixel 205a and a fifth low sub pixel 205b. The fifth high sub pixel 205a is electrically connected to the fifth gate line GL5 and the first data line DL1. A structure of the fifth high sub pixel 205a is substantially the same as the structure of the first high sub pixel 201a. The fifth low sub pixel 205b is electrically connected to the fifth gate line GL5 and the second data line DL2. A structure of the fifth low sub pixel 205b is substantially the same as the structure of the first low sub pixel 201b.

The sixth pixel 206 includes a sixth high sub pixel 206a and a sixth low sub pixel 206b. The sixth high sub pixel 206a is electrically connected to the sixth gate line GL6 and the second data line DL2. A structure of the sixth high sub pixel 206a is substantially the same as the structure of the first high sub pixel 201a. The sixth low sub pixel 206b is electrically connected to the sixth gate line GL6 and the first data line DL1. A structure of the sixth low sub pixel 206b is substantially the same as the structure of the first low sub pixel 201b.

The seventh pixel 207 includes a seventh high sub pixel 207a and a seventh low sub pixel 207b. The seventh high sub pixel 207a is electrically connected to the first gate line GL1 and the fourth data line DL4. A structure of the seventh high sub pixel 207a is substantially the same as the structure of the first high sub pixel 201a. The seventh low sub pixel 207b is electrically connected to the first gate line GL1 and the third data line DL3. A structure of the seventh low sub pixel 207b is substantially the same as the structure of the first low sub pixel 201b.

The eighth pixel 208 includes an eighth high sub pixel 208a and an eighth low sub pixel 208b. The eighth high sub pixel 208a is electrically connected to the second gate line GL2 and the third data line DL3. A structure of the eighth high sub pixel 208a is substantially the same as the structure of the first high sub pixel 201a. The eighth low sub pixel 208b is electrically connected to the second gate line GL2 and the fourth data line DL4. A structure of the eighth low sub pixel 208b is substantially the same as the structure of the first low sub pixel 201b.

The ninth pixel 209 includes a ninth high sub pixel 209a and a ninth low sub pixel 209b. The ninth high sub pixel 209a is electrically connected to the third gate line GL3 and the fourth data line DL4. A structure of the ninth high sub pixel 209a is substantially the same as the structure of the first high sub pixel 201a. The ninth low sub pixel 209b is electrically connected to the third gate line GL3 and the third data line DL3. A structure of the ninth low sub pixel 209b is substantially the same as the structure of the first low sub pixel 201b.

The tenth pixel 210 includes a tenth high sub pixel 210a and a tenth low sub pixel 210b. The tenth high sub pixel 210a is electrically connected to the fourth gate line GL4 and the third data line DL3. A structure of the tenth high sub pixel 210a is substantially the same as the structure of the first high sub pixel 201a. The tenth low sub pixel 210b is electrically connected to the fourth gate line GL4 and the fourth data line DL4. A structure of the tenth low sub pixel 210b is substantially the same as the structure of the first low sub pixel 201b.

The eleventh pixel 211 includes an eleventh high sub pixel 211a and an eleventh low sub pixel 211b. The eleventh high sub pixel 211a is electrically connected to the fifth gate line GL5 and the fourth data line DL4. A structure of the eleventh high sub pixel 211a is substantially the same as the structure of the first high sub pixel 201a. The eleventh low sub pixel 211b is electrically connected to the fifth gate line GL5 and the third data line DL3. A structure of the eleventh low sub pixel 211b is substantially the same as the structure of the first low sub pixel 201b.

The twelfth pixel 212 includes a twelfth high sub pixel 212a and a twelfth low sub pixel 212b. The twelfth high sub pixel 212a is electrically connected to the sixth gate line GL6 and the third data line DL3. A structure of the twelfth high sub pixel 212a is substantially the same as the structure of the first high sub pixel 201a. The twelfth low sub pixel 212b is electrically connected to the sixth gate line GL6 and the fourth data line DL4. A structure of the twelfth low sub pixel 212b is substantially the same as the structure of the first low sub pixel 201b.

The structure defined by the first to sixth gate lines GL1, GL2, . . . , GL6, the first to fourth data lines DL1, DL2, . . . , DL4 and the first to twelfth pixels 201, 202, . . . , 212 may be repeatedly disposed in the array portion 200 in first direction D1 and the second direction D2.

The pad portion 300 includes a first pad 310, a second pad 320, a third pad 330, a fourth pad 340, a fifth pad 350 and a sixth pad 360.

The first pad 310 outputs a positive first gate clock +GCK1 to the first gate line GL1. The first pad 310 may receive the positive first gate clock +GCK1 from an outside (e.g., an external device) to output the positive first gate clock +GCK1 to the first gate line GL1.

The second pad 320 outputs a positive second gate clock +GCK2 to the second gate line GL2. The second pad 320 may receive the positive second gate clock +GCK2 from the outside to output the positive second gate clock +GCK2 to the second gate line GL2.

The third pad 330 is electrically connected to the first pad 310, and outputs the positive first gate clock +GCK1 to the third gate line GL3. In an exemplary embodiment, the third pad 330 may receive the positive first gate clock +GCK1 from the outside to output the positive first gate clock +GCK1 to the third gate line GL3. In an alternative exemplary embodiment, the third pad 330 may receive the positive first gate clock +GCK1 from the first pad 310 to output the positive first gate clock +GCK1 to the third gate line GL3. In such an embodiment, the first pad 310 and the third pad 330 are electrically connected to each other as shown in FIG. 1A, but not being limited thereto. In one exemplary embodiment, for example, the first pad 310 and the third pad 330 may be formed with or defined by a same pad.

The fourth pad 340 outputs a negative second gate clock −GCK2 to the fourth gate line GL4. The fourth pad 340 may receive the negative second gate clock −GCK2 from the outside to output the negative second gate clock −GCK2 to the fourth gate line GL4.

The fifth pad 350 outputs a negative first gate clock −GCK1 to the fifth gate line GL5. The fifth pad 350 may receive the negative first gate clock −GCK1 from the outside to output the negative first gate clock −GCK1 to the fifth gate line GL5.

The sixth pad 360 is electrically connected to the fourth pad 340, and outputs the negative second gate clock −GCK2 to the sixth gate line GL6. In an exemplary embodiment, the sixth pad 360 may receive the negative second gate clock −GCK2 from the outside to output the negative second gate clock −GCK2 to the sixth gate line GL6. In an alternative exemplary embodiment, the sixth pad 360 may receive the negative second gate clock −GCK2 from the fourth pad 340 to output the negative second gate clock −GCK2 to the sixth gate line GL6. In such embodiment, the fourth pad 340 and the sixth pad 360 are electrically connected to each other as shown in FIG. 1A, but not being limited thereto. In one exemplary embodiment, for example, the fourth pad 340 and the sixth pad 360 may be formed with or defined by a same pad. The positive first gate clock +GCK1, the positive second gate clock +GCK2, the negative first gate clock −GCK1 and the negative second gate clock −GCK2 may be test signals for testing the first to twelfth pixels 201, 202, . . . , 212 in the array portion 200.

Figure 2:
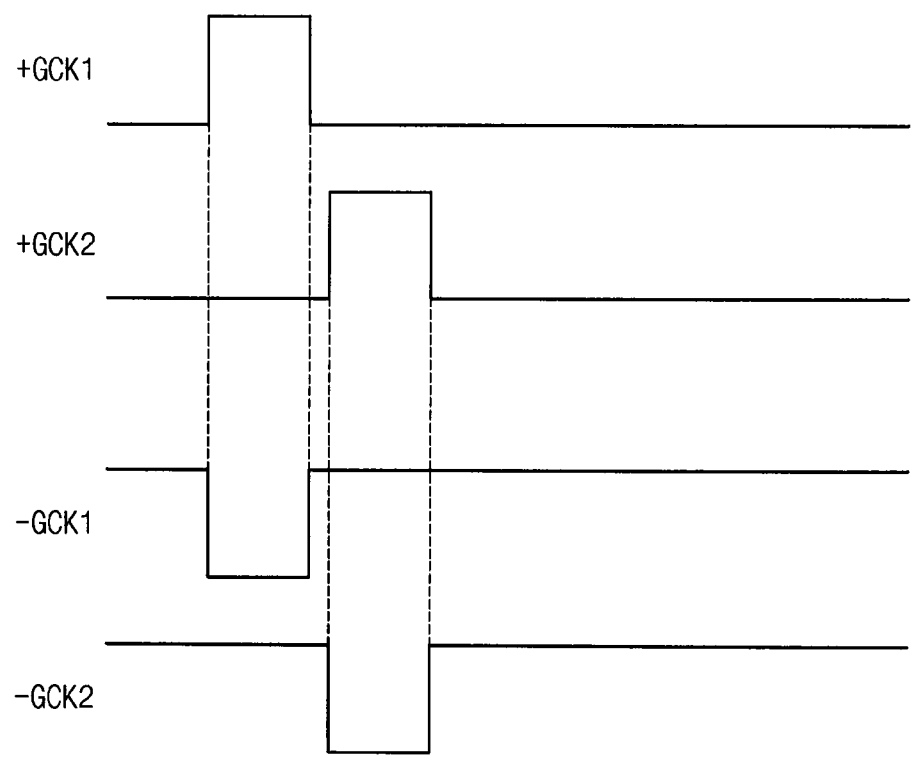
FIG. 2 is a signal timing diagram of a positive first gate clock, the positive second gate clock, a negative first gate clock and a negative second gate clock of FIG. 1A.

FIG. 2 is a signal timing diagram of the positive first gate clock +GCK1, the positive second gate clock +GCK2, the negative first gate clock −GCK1 and the negative second gate clock −GCK2 of FIG. 1A.

Referring to FIGS. 1A and 2, in an exemplary embodiment, the positive second gate clock +GCK2 and the negative second gate clock −GCK2 are activated, e.g., in a high level, after the positive first gate clock +GCK1 and the negative first gate clock −GCK1 are activated. In such an embodiment, the positive first gate clock +GCK1 and the negative first gate clock −GCK1 are simultaneously activated, and the positive second gate clock +GCK2 and the negative second gate clock −GCK2 are activated after the positive first gate clock +GCK1 and the negative first gate clock −GCK1 are deactivated, e.g., in a low level.

The negative first gate clock −GCK1 is inverted to the positive first gate clock +GCK1, and the negative second gate clock −GCK2 is inverted to the positive second gate clock +GCK2. In such an embodiment, polarities of the first to fourth data signals transferred through the first to fourth data lines DL1, DL2, . . . , DL4 of FIG. 1A when the positive second gate clock +GCK2 and the negative second gate clock −GCK2 are activated are opposite to polarities of the first to fourth data signals transferred through the first to fourth data lines DL1, DL2, . . . , DL4 of FIG. 1A when the positive first gate clock +GCK1 and the negative first gate clock −GCK1 are activated.

Figure 3A:
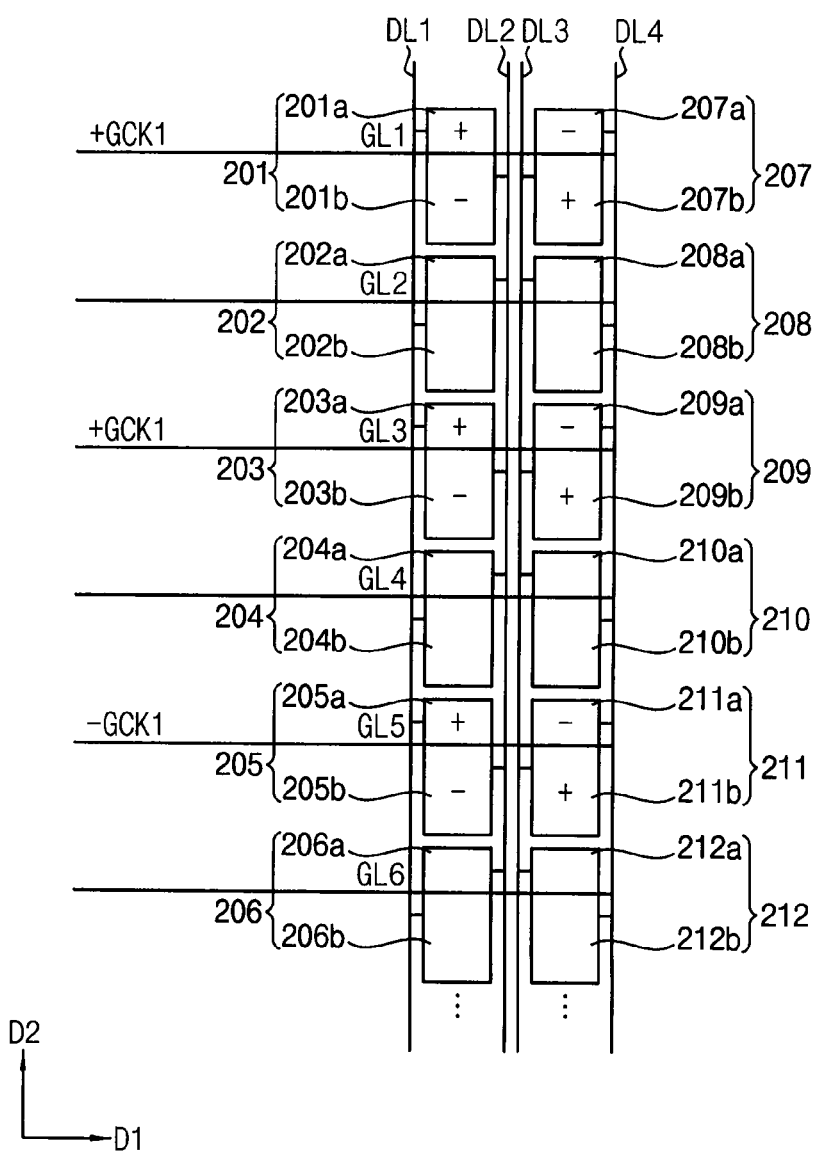
FIG. 3A is a plan view illustrating first to twelfth pixels of FIG. 1A, when the positive first gate clock, the positive first gate clock and the negative first gate clock are respectively applied to a first gate line, a third gate line and a fifth gate line.

FIG. 3A is a plan view illustrating the first to twelfth pixels 201, 202, . . . , 212 of FIG. 1A, when the positive first gate clock +GCK1, the positive first gate clock +GCK1 and the negative first gate clock −GCK1 are respectively applied to the first gate line GL1, the third gate line GL3 and the fifth gate line GL5.

Referring to FIGS. 1A to 3A, when the positive first gate clock +GCK1, the positive first gate clock +GCK1 and the negative first gate clock −GCK1 are respectively applied to the first gate line GL1, the third gate line GL3 and the fifth gate line GL5 for testing the pixels in the array portion 200, the first data signal applied to the first data line DL1 may have a positive polarity, the second data signal applied to the second data line DL2 may have a negative polarity, the third data signal applied to the third data line DL3 may have the positive polarity, and the fourth data signal applied to the fourth data line DL4 may have the negative polarity.

In an exemplary embodiment, the positive polarity and the negative polarity may be defined with reference to a reference voltage. In such an embodiment, the data signal has the positive polarity when the data signal is greater than the reference voltage, and the data signal has the negative polarity when the data signal is less than the reference voltage. In one exemplary embodiment, for example, the reference voltage may be about zero (0) volt. Alternatively, the reference voltage may be a common voltage.

Thus, in such an embodiment, when the positive first gate clock +GCK1, the positive first gate clock +GCK1 and the negative first gate clock −GCK1 are respectively applied to the first gate line GL1, the third gate line GL3 and the fifth gate line GL5, a data voltage having the positive polarity is charged to each of the first high sub pixel 201a, the third high sub pixel 203a, the fifth high sub pixel 205a, the seventh low sub pixel 207b, the ninth low sub pixel 209b and the eleventh low sub pixel 211b. In such an embodiment, when the positive first gate clock +GCK1, the positive first gate clock +GCK1 and the negative first gate clock −GCK1 are respectively applied to the first gate line GL1, the third gate line GL3 and the fifth gate line GL5, a data voltage having the negative polarity is charged to each of the first low sub pixel 201b, the third low sub pixel 203b, the fifth low sub pixel 205b, the seventh high sub pixel 207a, the ninth high sub pixel 209b and the eleventh high sub pixel 211a.

Figure 3B:
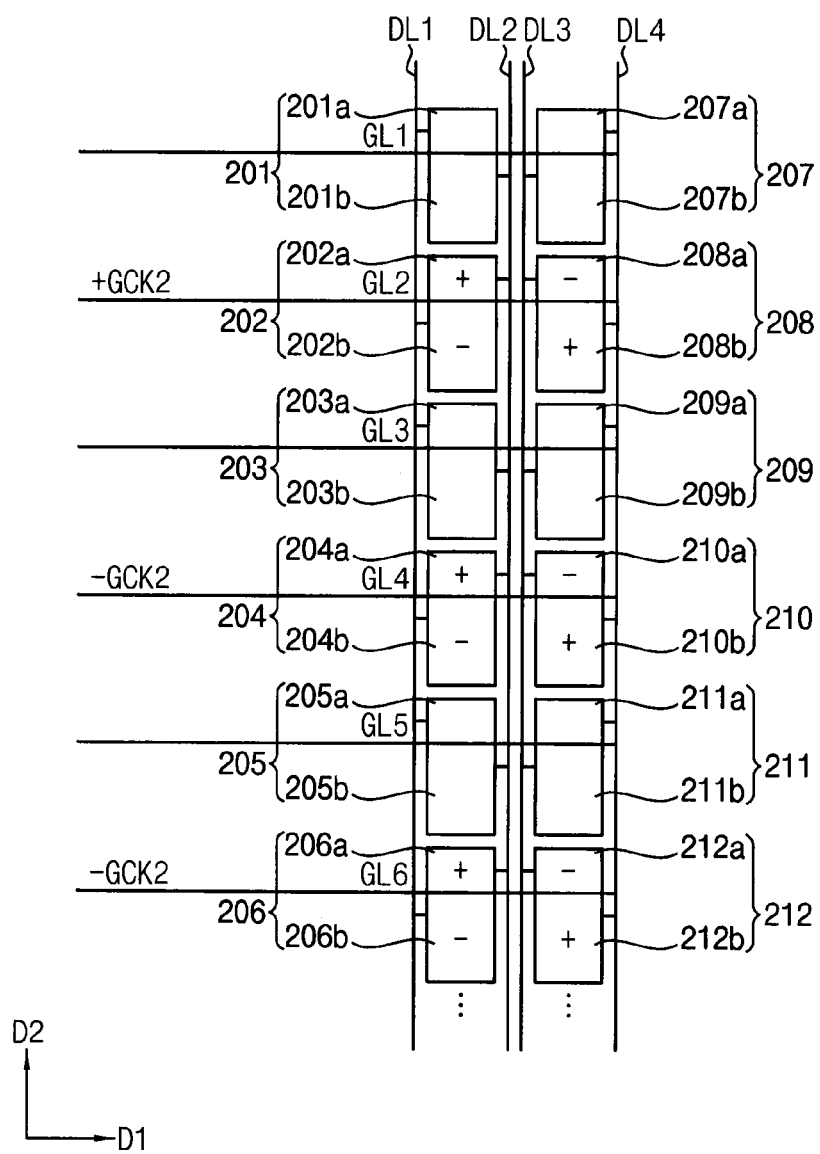
FIG. 3B is a plan view illustrating the first to twelfth pixels of FIG. 1A, when the positive second gate clock, the negative second gate clock and the negative second gate clock are respectively applied to a second gate line, a fourth gate line and a sixth gate line.

FIG. 3B is a plan view illustrating the first to twelfth pixels 201, 202, . . . , 212 of FIG. 1A, when the positive second gate clock +GCK2, the negative second gate clock −GCK2 and the negative second gate clock −GCK2 are respectively applied to the second gate line GL2, the fourth gate line GL4 and the sixth gate line GL6.

Referring to FIGS. 1A to 3B, when the positive second gate clock +GCK2, the negative second gate clock −GCK2 and the negative second gate clock −GCK2 are respectively applied to the second gate line GL2, the fourth gate line GL4 and the sixth gate line GL6 for testing the pixels in the array portion 200, the first data signal applied to the first data line DL1 may have the negative polarity, the second data signal applied to the second data line DL2 may have the positive polarity, the third data signal applied to the third data line DL3 may have the negative polarity, and the fourth data signal applied to the fourth data line DL4 may have the positive polarity.

Thus, in such an embodiment, when the positive second gate clock +GCK2, the negative second gate clock −GCK2 and the negative second gate clock −GCK2 are respectively applied to the second gate line GL2, the fourth gate line GL4 and the sixth gate line GL6, the data voltage having the positive polarity is charged to each of the second high sub pixel 202a, the fourth high sub pixel 204a, the sixth high sub pixel 206a, the eighth low sub pixel 208b, the tenth low sub pixel 210b and the twelfth low sub pixel 212b. In such an embodiment, when the positive second gate clock +GCK2, the negative second gate clock −GCK2 and the negative second gate clock −GCK2 are respectively applied to the second gate line GL2, the fourth gate line GL4 and the sixth gate line GL6, the data voltage having the negative polarity is charged to each of the second low sub pixel 202b, the fourth low sub pixel 204b, the sixth low sub pixel 206b, the eighth high sub pixel 208a, the tenth high sub pixel 210a and the twelfth high sub pixel 212a.

Figure 3C:
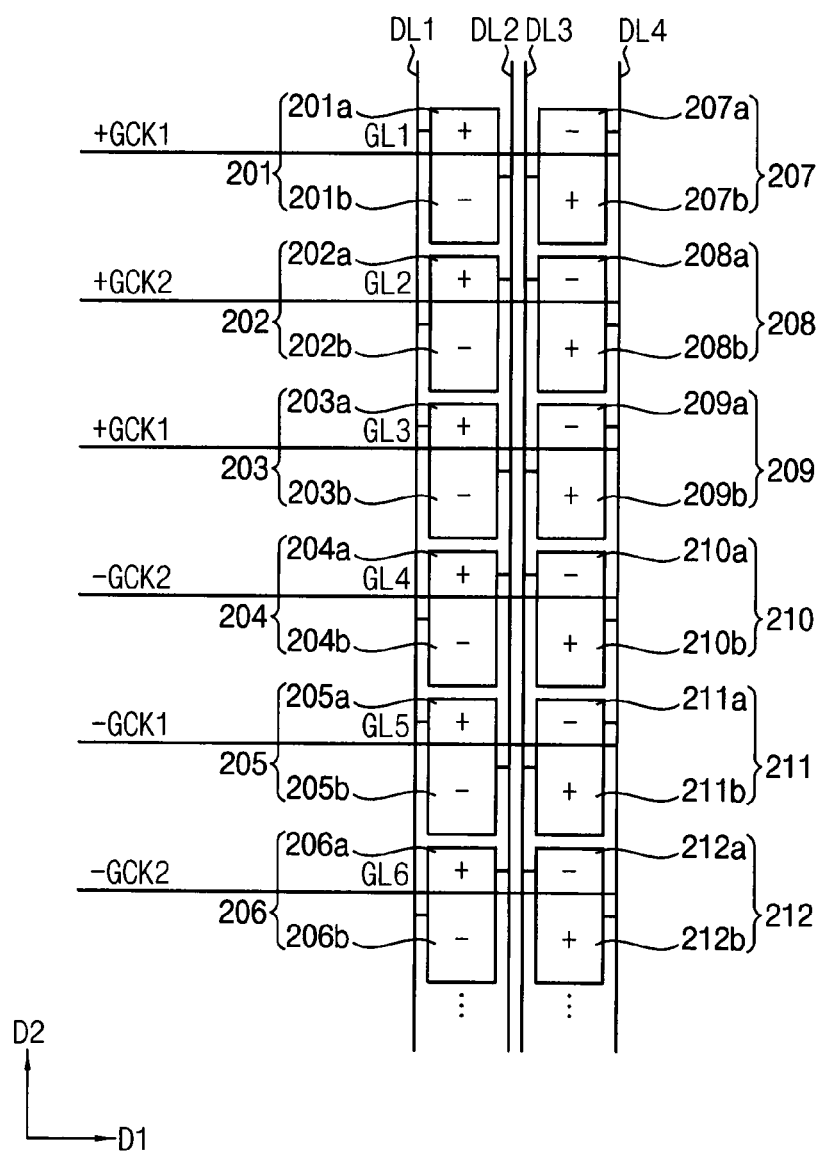
FIG. 3C is a plan view illustrating the first to twelfth pixels of FIG. 1A, when the positive first gate clock, the positive first gate clock, the negative first gate clock, the positive second gate clock, the negative second gate clock and the negative second gate clock are respectively applied to the first gate line, the third gate line, the fifth gate line, the second gate line, the fourth gate line and the sixth gate line.

FIG. 3C is a plan view illustrating the first to twelfth pixels 201, 202, . . . , 212 of FIG. 1A, when the positive first gate clock +GCK1, the positive first gate clock +GCK1, the negative first gate clock −GCK1, the positive second gate clock +GCK2, the negative second gate clock −GCK2 and the negative second gate clock −GCK2 are respectively applied to the first gate line GL1, the third gate line GL3, the fifth gate line GL5, the second gate line GL2, the fourth gate line GL4 and the sixth gate line GL6.

Referring to FIGS. 1A to 3C, in an exemplary embodiment, polarities of high sub pixels adjacent in the first direction D1 are different from each other. In one exemplary embodiment, for example, the first high sub pixel 201a has the positive polarity and the seventh high sub pixel 207a has the negative polarity. In such an embodiment, polarities of low sub pixels adjacent in the first direction D1 are different from each other. In one exemplary embodiment, for example, the first low sub pixel 201b has the negative polarity and the seventh low sub pixel 207b has the positive polarity. In such an embodiment, polarities of a low sub pixel and a high sub pixel adjacent in the second direction D2 are different from each other. In one exemplary embodiment, for example, the first low sub pixel 201b has the negative polarity and the second high sub pixel 202a has the positive polarity.

Figure 4:
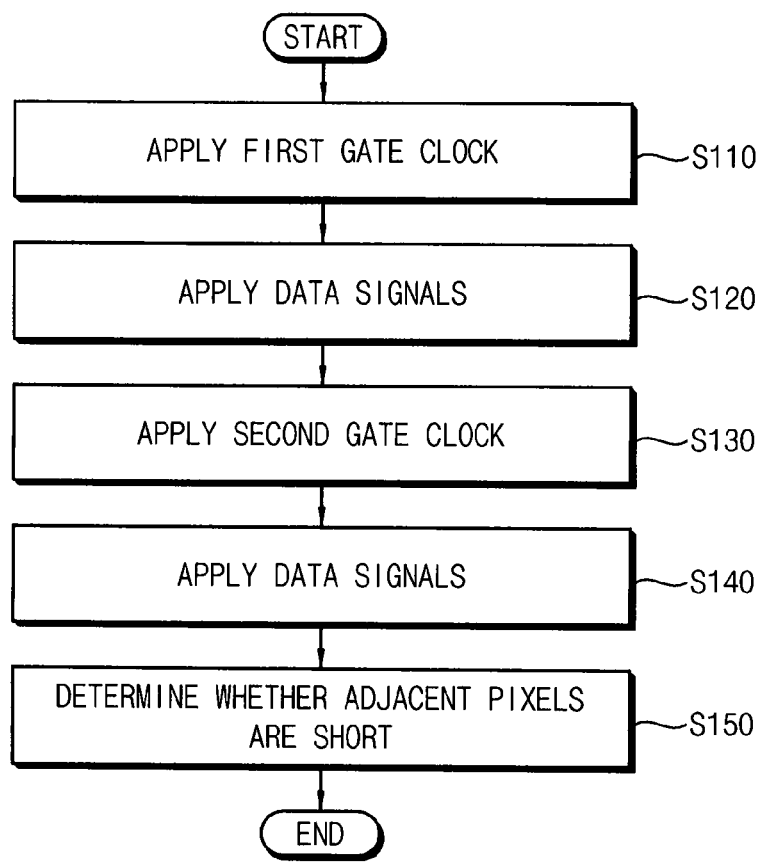
FIG. 4 is a flow chart illustrating an exemplary embodiment of a method of testing the display substrate of FIG. 1A.

FIG. 4 is a flow chart illustrating an exemplary embodiment of a method of testing the display substrate 100 of FIG. 1A.

Referring to FIGS. 1A to 4, in an exemplary embodiment of a method of testing the display substrate 100, the first gate clocks are applied (S110). In an exemplary embodiment, the first gate clocks include the positive first gate clock +GCK1 and the negative first gate clock −GCK1. The positive first gate clock +GCK1 is applied from the first pad 310 to the first gate line GL1, the positive first gate clock +GCK1 is applied from the third pad 330 to the third gate line GL3, and the negative first gate clock −GCK1 is applied from the fifth pad 350 to the fifth gate line GL5 for testing the pixels in the array portion 200.

In such an embodiment, the data signals are applied (S120). In an exemplary embodiment, when the positive first gate clock +GCK1, the positive first gate clock +GCK1 and the negative first gate clock −GCK1 are respectively applied to the first gate line GL1, the third gate line GL3 and the fifth gate line GL5 for testing the pixels in the array portion 200, the first data signal applied to the first data line DL1 may have the positive polarity, the second data signal applied to the second data line DL2 may have the negative polarity, the third data signal applied to the third data line DL3 may have the positive polarity, and the fourth data signal applied to the fourth data line DL4 may have the negative polarity.

Thus, the data voltage having the positive polarity is charged to each of the first high sub pixel 201a, the third high sub pixel 203a, the fifth high sub pixel 205a, the seventh low sub pixel 207b, the ninth low sub pixel 209b and the eleventh low sub pixel 211b. The data voltage having the negative polarity is charged to each of the first low sub pixel 201b, the third low sub pixel 203b, the fifth low sub pixel 205b, the seventh high sub pixel 207a, the ninth high sub pixel 209b and the eleventh high sub pixel 211a.

In such an embodiment, the second gate clocks are applied (S130). In an exemplary embodiment, the second gate clocks include the positive second gate clock +GCK2 and the negative second gate clock −GCK2. The positive second gate clock +GCK2 is applied from the second pad 320 to the second gate line GL2, the negative second gate clock −GCK2 is applied from the fourth pad 340 to the fourth gate line GL4, and the negative second gate clock −GCK2 is applied from the sixth pad 360 to the sixth gate line GL6.

In such an embodiment, the data signals are applied (S140). When the positive second gate clock +GCK2, the negative second gate clock −GCK2 and the negative second gate clock −GCK2 are respectively applied to the second gate line GL2, the fourth gate line GL4 and the sixth gate line GL6 for testing the pixels in the array portion 200, the first data signal applied to the first data line DL1 may have the negative polarity, the second data signal applied to the second data line DL2 may have the positive polarity, the third data signal applied to the third data line DL3 may have the negative polarity, and the fourth data signal applied to the fourth data line DL4 may have the positive polarity.

Thus, the data voltage having the positive polarity is charged to each of the second high sub pixel 202a, the fourth high sub pixel 204a, the sixth high sub pixel 206a, the eighth low sub pixel 208b, the tenth low sub pixel 210b and the twelfth low sub pixel 212b. In addition, the data voltage having the negative polarity is charged to each of the second low sub pixel 202b, the fourth low sub pixel 204b, the sixth low sub pixel 206b, the eighth high sub pixel 208a, the tenth high sub pixel 210a and the twelfth high sub pixel 212a.

In such an embodiment, it is determined whether the adjacent pixels are short or not (S150). In such an embodiment, whether the adjacent pixels are short or not may be determined by detecting a point having the reference voltage in the adjacent pixels. In an exemplary embodiment, the polarities of the high sub pixels adjacent in the first direction D1 are different from each other. Therefore, when the high sub pixels adjacent in the first direction D1 are short, the reference voltage defining the positive polarity and the negative polarity is detected at a point where the adjacent high sub pixels are short. In such an embodiment, the polarities of the low sub pixels adjacent in the first direction D1 are different from each other. Therefore, when the low sub pixels adjacent in the first direction D1 are short, the reference voltage defining the positive polarity and the negative polarity is detected at a point where the adjacent low sub pixels are short. In such an embodiment, the polarities of the low sub pixel and the high sub pixel adjacent in the second direction D2 are different from each other. Therefore, when the low sub pixel and the high sub pixel adjacent in the second direction D2 are short, the reference voltage defining the positive polarity and the negative polarity is detected at a point where the adjacent low sub pixel and high sub pixel are short.

Figure 5:
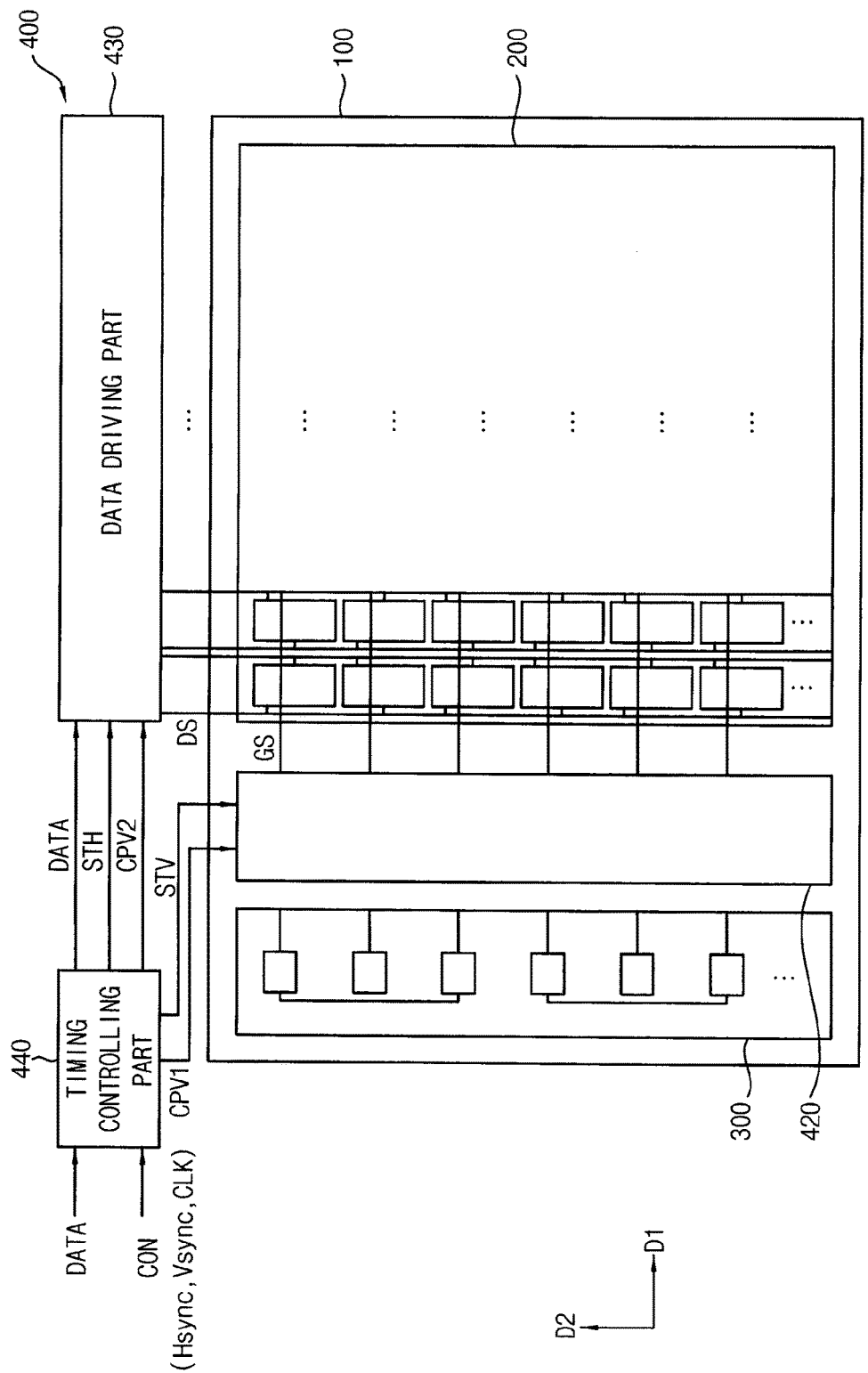
FIG. 5 is a block diagram illustrating an exemplary embodiment of a display apparatus including the display substrate of FIG. 1A.

FIG. 5 is a block diagram illustrating an exemplary embodiment of a display apparatus including the display substrate 100 of FIG. 1A.

Referring to FIG. 5, an exemplary embodiment of the display apparatus 400 includes the display substrate 100, a gate driving part 420, a data driving part 430 and a timing controlling part 440.

The display substrate 100 includes the array portion 200 and the pad portion 300 of FIG. 1A.

In such an embodiment, as described above, the positive first gate clock +GCK1, the positive second gate clock +GCK2, the negative first gate clock −GCK1 and the negative second gate clock −GCK2, which are test signals for testing the pixels in the array portion 200, e.g., the first to twelfth pixels 201, 202, . . . , 212, may be applied to the array portion 200 through the pad portion 300. In such an embodiment, the pad portion 300 may be disconnected from the array portion 200 after performing the test.

The gate driving part 420 outputs gate signals GS to gate lines GL including the first to sixth gate lines GL1, GL2, . . . , GL6 of FIG. 1A. In an exemplary embodiment, the gate driving part 420 generates gate signals GS in response to a gate start signal STV and a gate clock signal CPV1 provided from the timing controlling part 440, and outputs the gate signals GS to the gate lines. In an exemplary embodiment, the gate driving part 420 may be disposed on the display substrate 100, e.g., between the array portion 200 and the pad portion 300. Alternatively, the gate driving part 420 may be disposed outside of the display substrate 100.

The data driving part 430 outputs data signals DS to data lines including the first to fourth data lines DL1, DL2, . . . , DL4 of FIG. 1A. In an exemplary embodiment, the data driving part 430 outputs the data signals DS based on an image data DATA to the data lines DL in response to a data start signal STH and a data clock signal CPV2, which are provided from the timing controlling part 440.

The timing controlling part 440 receives the image data DATA and a control signal CON from the outside. The control signal CON may include a horizontal synchronous signal Hsync, a vertical synchronous signal Vsync and a clock signal CK. The timing controlling part 440 generates the data start signal STH using the horizontal synchronous signal Hsync and outputs the data start signal STH to the data driving part 430. In addition, the timing controlling part 440 generates the gate start signal STV using the vertical synchronous signal Vsync and outputs the gate start signal STV to the gate driving part 420. In addition, the timing controlling part 440 generates the gate clock signal CPV1 and the data clock signal CPV2 using the clock signal CK, outputs the gate clock signal CPV1 to the gate driving part 420 and outputs the data clock signal CPV2 to the data driving part 430.

According to an exemplary embodiment, as described above, when testing the pixels in the array portion 200, the polarities of the high sub pixels adjacent in the first direction D1 are different from each other, the polarities of the low sub pixels adjacent in the first direction D1 are different from each other, and the polarities of the low sub pixel and the high sub pixel adjacent in the second direction D2 are different from each other, therefore, a short between the pixels 201, 202, . . . , 212 may be effectively detected based on detecting a point having the reference voltage in adjacent pixels. Thus, defect detection ratio of the display substrate 100 may be increased.

Figure 6A:
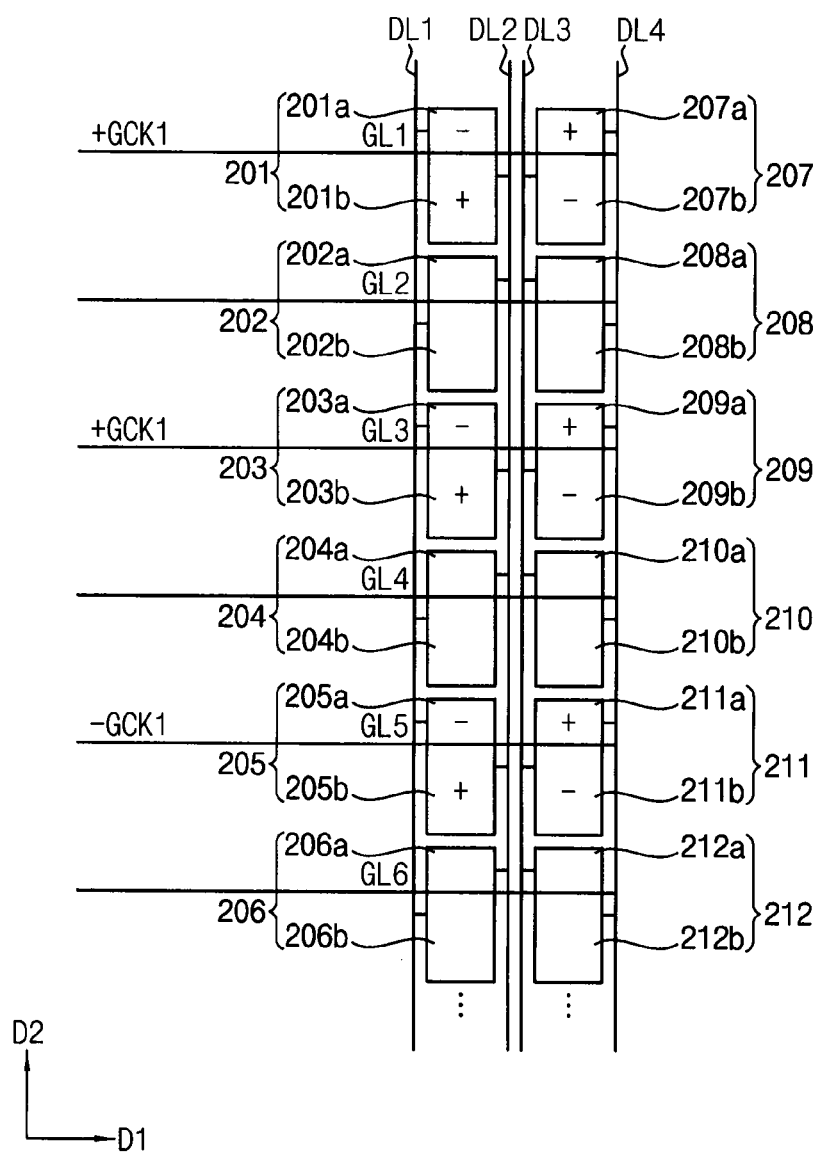
FIG. 6A is a plan view illustrating first to twelfth pixels of an exemplary embodiment of a display substrate, when a positive first gate clock, the positive first gate clock and a negative first gate clock are respectively applied to a first gate line, a third gate line and a fifth gate line, according to the invention.

FIG. 6A is a plan view illustrating first to twelfth pixels 201, 202, . . . , 212 of an exemplary embodiment of the display apparatus, when a positive first gate clock +GCK1, the positive first gate clock +GCK1 and a negative first gate clock −GCK1 are respectively applied to a first gate line GL1, a third gate line GL3 and a fifth gate line GL5, according to the invention.

The positive first gate clock +GCK1 may be applied from the first pad 310 of FIG. 1A to the first gate line GL1, the positive first gate clock +GCK1 may be applied from the third pad 330 of FIG. 1A to the third gate line GL3, and the negative first gate clock −GCK1 may be applied from the fifth pad 350 of FIG. 1A to the fifth gate line GL5 for testing the pixels in the array portion 200.

In an exemplary embodiment, the display apparatus may include the display substrate 100 shown in FIG. 1A, and the first to twelfth pixels 201, 202, ..., 212 may be a portion of the pixels in the display substrate 100 of FIG. 1A. In such an embodiment, the first to twelfth pixels 201, 202, ..., 212 shown in FIG. 6A may be substantially the same as the first to twelfth pixels 201, 202, ..., 212 shown in FIG. 1A.

Thus, the same or like elements shown in FIG. 6A have been labeled with the same reference characters as used above to describe the exemplary embodiment shown in FIG. 1A, and any repetitive detailed description thereof will be omitted.

Referring to FIG. 6A, when the positive first gate clock +GCK1, the positive first gate clock +GCK1 and the negative first gate clock −GCK1 are respectively applied to the first gate line GL1, the third gate line GL3 and the fifth gate line GL5 for testing the pixels in the array portion 200, the first data signal applied to the first data line DL1 may have the negative polarity, the second data signal applied to the second data line DL2 may have the positive polarity, the third data signal applied to the third data line DL3 may have the negative polarity, and the fourth data signal applied to the fourth data line DL4 may have the positive polarity.

Thus, the data voltage having the negative polarity is charged to each of the first high sub pixel 201a, the third high sub pixel 203a, the fifth high sub pixel 205a, the seventh low sub pixel 207b, the ninth low sub pixel 209b and the eleventh low sub pixel 211b. In addition, the data voltage having the positive polarity is charged to each of the first low sub pixel 201b, the third low sub pixel 203b, the fifth low sub pixel 205b, the seventh high sub pixel 207a, the ninth high sub pixel 209b and the eleventh high sub pixel 211a.

Figure 6B:
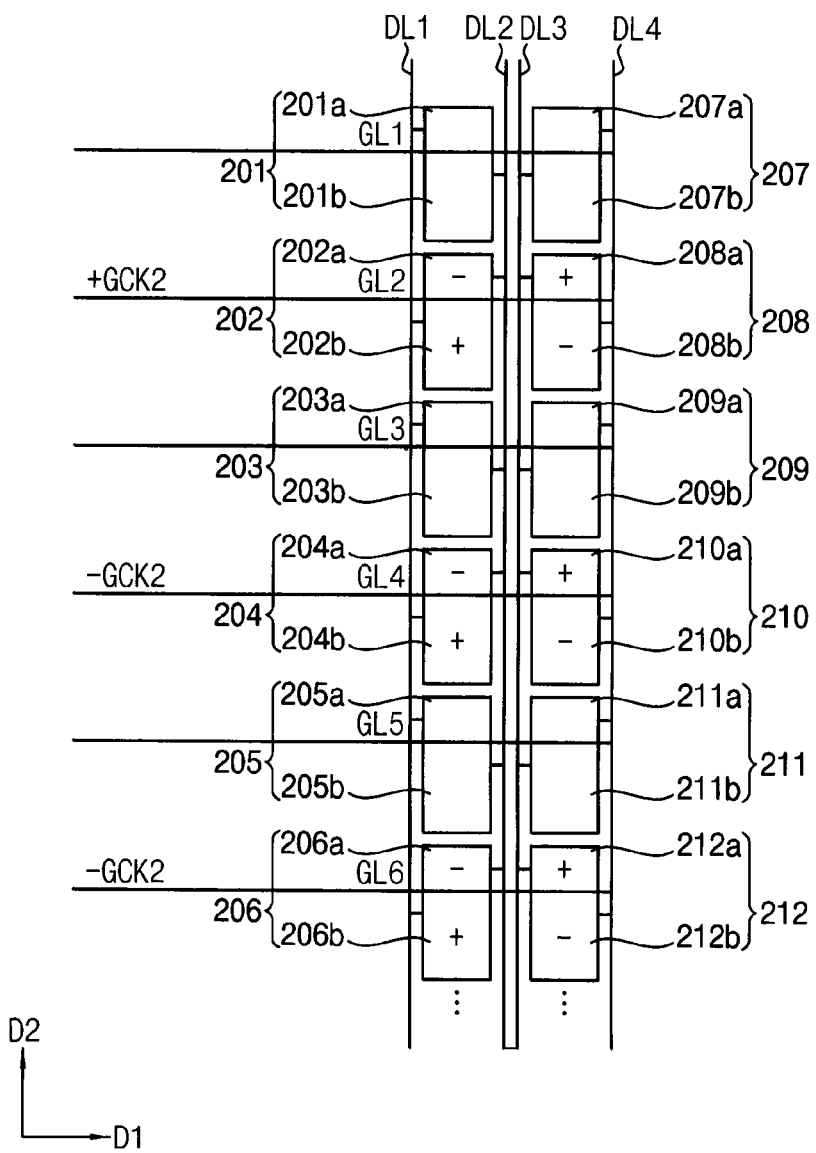
FIG. 6B is a plan view illustrating the first to twelfth pixels of an exemplary embodiment of a display substrate, when the positive second gate clock, the negative second gate clock and the negative second gate clock are respectively applied to the second gate line, the fourth gate line and the sixth gate line, according to the invention.

FIG. 6B is a plan view illustrating the first to twelfth pixels 201, 202, ..., 212 of an exemplary embodiment of the display apparatus, when the positive second gate clock +GCK2, the negative second gate clock −GCK2 and the negative second gate clock −GCK2 are respectively applied to the second gate line GL2, the fourth gate line GL4 and the sixth gate line GL6, according to the invention.

The positive second gate clock +GCK2 may be applied from the second pad 320 of FIG. 1A to the second gate line GL2, the negative second gate clock −GCK2 may be applied from the fourth pad 340 of FIG. 1A to the fourth gate line GL4, and the negative second gate clock −GCK2 may be applied from the sixth pad 360 of FIG. 1A to the sixth gate line GL6, thereby testing the pixels in the array portion 200.

As shown in FIG. 2, the positive second gate clock +GCK2 and the negative second gate clock −GCK2 are activated after the positive first gate clock +GCK1 and the negative first gate clock −GCK1 are activated. In an exemplary embodiment, the positive first gate clock +GCK1 and the negative first gate clock −GCK1 are simultaneously activated, and the positive second gate clock +GCK2 and the negative second gate clock −GCK2 are activated after the positive first gate clock +GCK1 and the negative first gate clock −GCK1 are deactivated.

Referring to FIG. 6B, when the positive second gate clock +GCK2, the negative second gate clock −GCK2 and the negative second gate clock −GCK2 are respectively applied to the second gate line GL2, the fourth gate line GL4 and the sixth gate line GL6, the first data signal applied to the first data line DL1 may have the positive polarity, the second data signal applied to the second data line DL2 may have the negative polarity, the third data signal applied to the third data line DL3 may have the positive polarity, and the fourth data signal applied to the fourth data line DL4 may have the negative polarity.

Thus, in an exemplary embodiment, the data voltage having the negative polarity is charged to each of the second high sub pixel 202a, the fourth high sub pixel 204a, the sixth high sub pixel 206a, the eighth low sub pixel 208b, the tenth low sub pixel 210b and the twelfth low sub pixel 212b. In such an embodiment, the data voltage having the negative polarity is charged to each of the second low sub pixel 202b, the fourth low sub pixel 204b, the sixth low sub pixel 206b, the eighth high sub pixel 208a, the tenth high sub pixel 210a and the twelfth high sub pixel 212a.

Figure 6C:
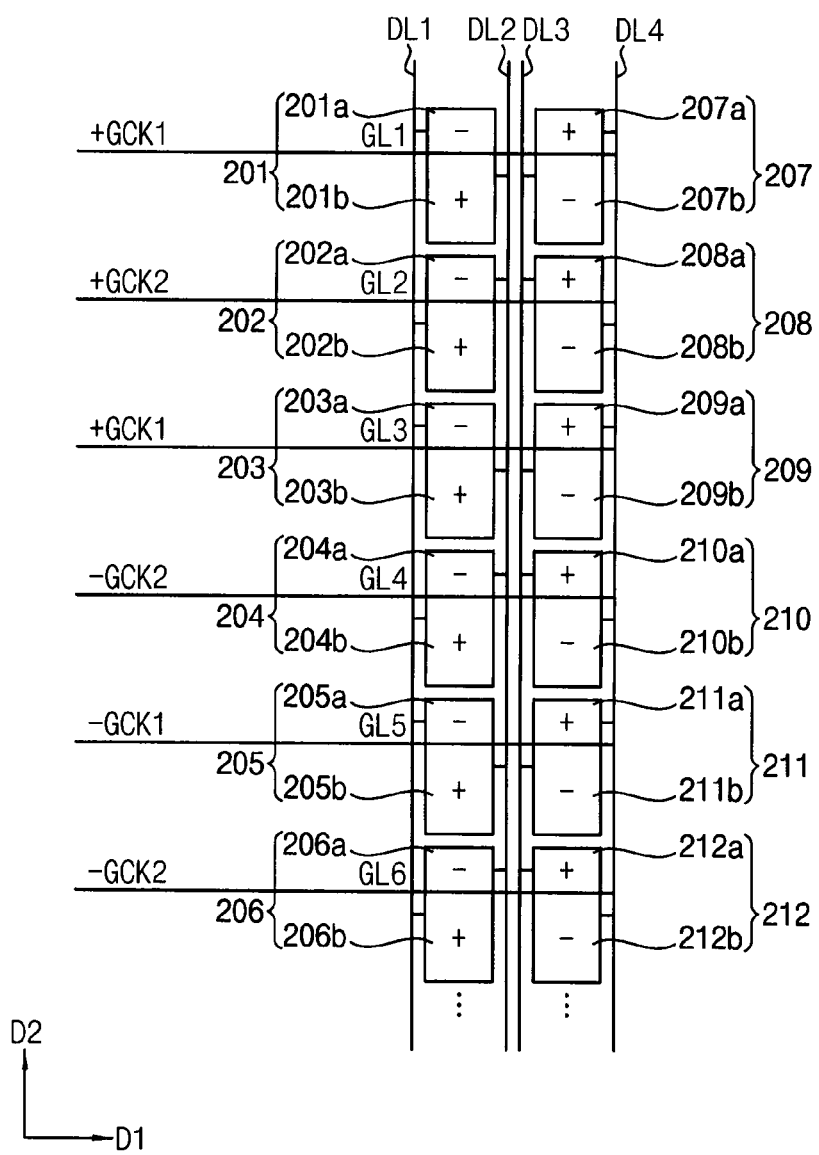
FIG. 6C is a plan view illustrating the first to twelfth pixels of an exemplary embodiment of a display substrate, when the positive first gate clock, the positive first gate clock, the negative first gate clock, the positive second gate clock, the negative second gate clock and the negative second gate clock are respectively applied to the first gate line, the third gate line, the fifth gate line, the second gate line, the fourth gate line and the sixth gate line, according to the invention.

FIG. 6C is a plan view illustrating the first to twelfth pixels 201, 202, ..., 212 of an exemplary embodiment of the display apparatus, when the positive first gate clock +GCK1, the positive first gate clock +GCK1, the negative first gate clock −GCK1, the positive second gate clock +GCK2, the negative second gate clock −GCK2 and the negative second gate clock −GCK2 are respectively applied to the first gate line GL1, the third gate line GL3, the fifth gate line GL5, the second gate line GL2, the fourth gate line GL4 and the sixth gate line GL6, according to the invention.

Referring to FIG. 6C, in an exemplary embodiment, polarities of high sub pixels adjacent in the first direction D1 are different from each other. In one exemplary embodiment, for example, the first high sub pixel 201a has the negative polarity and the seventh high sub pixel 207a has the positive polarity. In such an embodiment, polarities of low sub pixels adjacent in the first direction D1 are different from each other. In one exemplary embodiment, for example, the first low sub pixel 201b has the positive polarity and the seventh low sub pixel 207b has the negative polarity. In such an embodiment, polarities of a low sub pixel and a high sub pixel adjacent in the second direction D2 are different from each other. In one exemplary embodiment, for example, the first low sub pixel 201b has the positive polarity and the second high sub pixel 202a has the negative polarity.

According to an exemplary embodiment, the polarities of the high sub pixels adjacent in the first direction D1 are different from each other, the polarities of the low sub pixels adjacent in the first direction D1 are different from each other, and the polarities of the low sub pixel and the high sub pixel adjacent in the second direction D2 are different from each other, therefore, a short between the pixels 201, 202, ..., 212 may be effectively detected based on detecting a point having the reference voltage in adjacent pixels. Thus, defect detection ratio of the display substrate 100 may be increased.

Figure 7A:
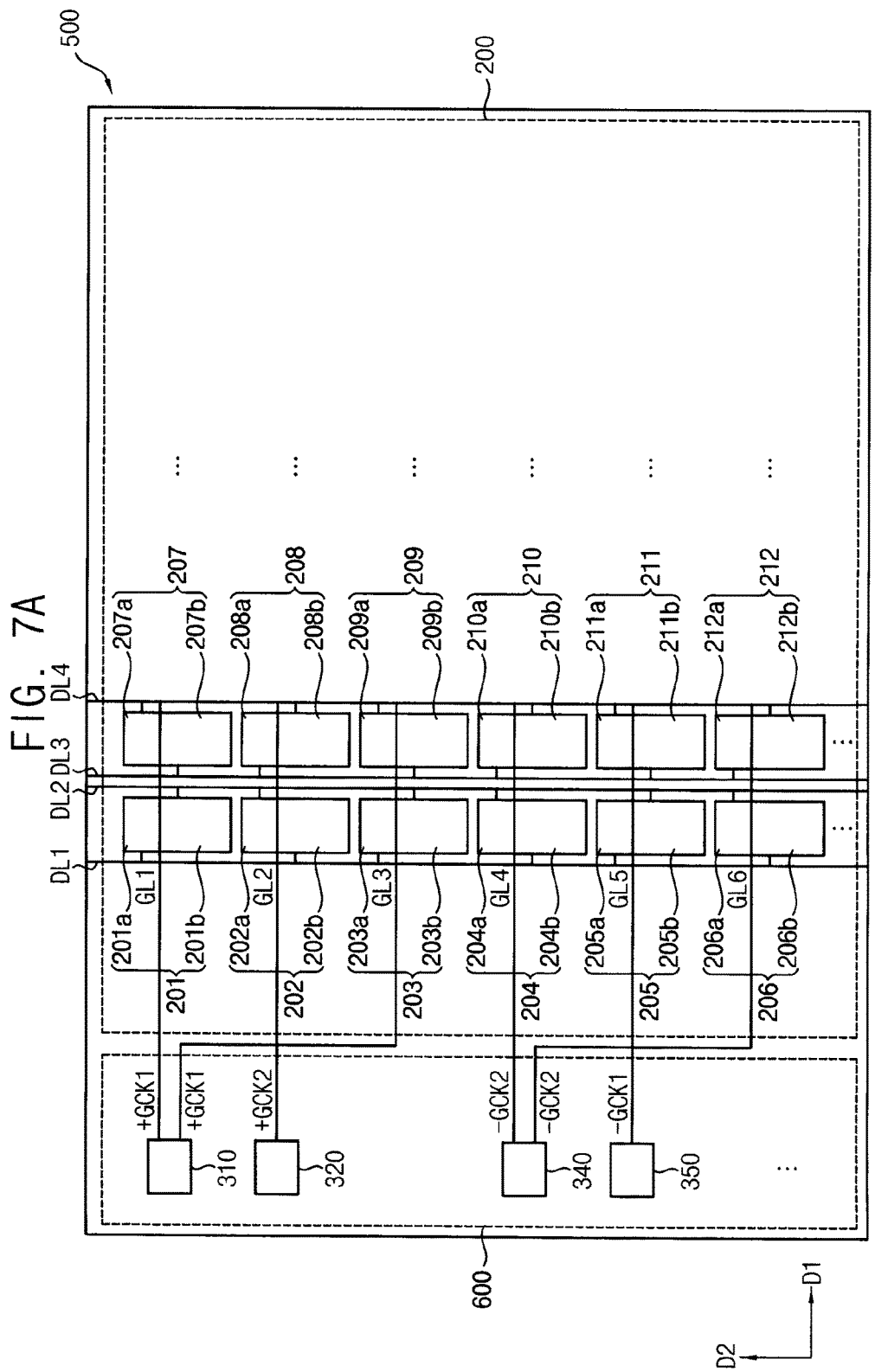
FIG. 7A is a plan view illustrating an alternative exemplary embodiment of a display substrate according to the invention.
Figure 7B:
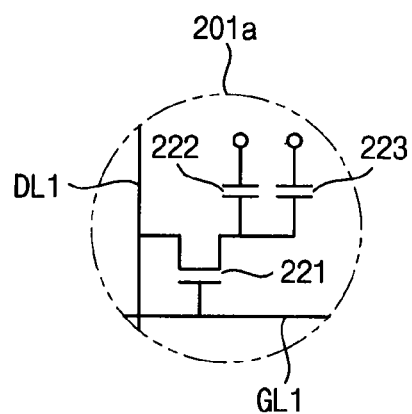
FIGS. 7B and 7C are circuit diagrams showing sub-pixels of a pixel of the display substrate shown in FIG. 7A
Figure 7C:
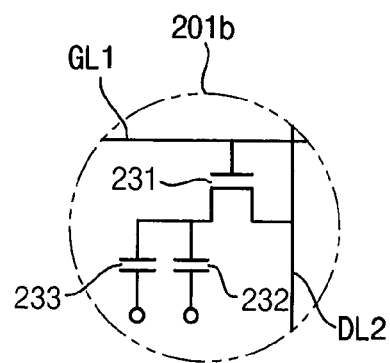

FIG. 7A is a plan view illustrating an alternative exemplary embodiment of a display substrate according to the invention, and FIGS. 7B and 7C are circuit diagrams showing sub-pixels of a pixel of the display substrate shown in FIG. 7A.

The display substrate 500 shown in FIGS. 7A to 7C is substantially the same as the display substrate 100 illustrated in FIGS. 1A to 1C except for a pad portion 600. The same or like elements shown in FIGS. 7A to 7C have been labeled with the same reference characters as used above to describe the exemplary embodiments of the display substrate shown in FIGS. 1A to 1C, and any repetitive detailed description thereof will hereinafter be omitted or simplified.

Referring to FIG. 7A, the display substrate 500 includes the array portion 200 and the pad portion 600.

The pad portion 600 includes the first pad 310, the second pad 320, the fourth pad 340 and the fifth pad 350. In such an embodiment, the third pad 330 and the sixth pad 360 shown in FIG. 1A are omitted.

In an exemplary embodiment, the first pad 310 outputs the positive first gate clock +GCK1 to the first gate line GL1. In such an embodiment, the first pad 310 outputs the positive first gate clock +GCK1 to the third gate line GL3. The first pad 310 may receive the positive first gate clock +GCK1 from the outside to output the positive first gate clock +GCK1 to the first gate line GL1 and the third gate line GL3.

The second pad 320 outputs the positive second gate clock +GCK2 to the second gate line GL2. The second pad 320 may receive the positive second gate clock +GCK2 from the outside to output the positive second gate clock +GCK2 to the second gate line GL2.

The fourth pad 340 outputs the negative second gate clock −GCK2 to the fourth gate line GL4. In addition, the fourth pad 340 outputs the negative second gate clock −GCK2 to the sixth gate line GL6. The fourth pad 340 may receive the negative second gate clock −GCK2 from the outside to output the negative second gate clock −GCK2 to the fourth gate line GL4 and the sixth gate line GL6.

The fifth pad 350 outputs the negative first gate clock −GCK1 to the fifth gate line GL5. The fifth pad 350 may receive the negative first gate clock −GCK1 from the outside to output the negative first gate clock −GCK1 to the fifth gate line GL5.

When the positive first gate clock +GCK1, the positive first gate clock +GCK1, the negative first gate clock −GCK1, the positive second gate clock +GCK2, the negative second gate clock −GCK2 and the negative second gate clock −GCK2 are respectively applied to the first gate line GL1, the third gate line GL3, the fifth gate line GL5, the second gate line GL2, the fourth gate line GL4 and the sixth gate line GL6 for testing the pixels in the array portion 200, the first to twelfth pixels 201, 202, . . . , 212 may have polarities substantially the same as the polarities of the first to twelfth pixels 201, 202, . . . , 212 of FIG. 3C.

Alternatively, when the positive first gate clock +GCK1, the positive first gate clock +GCK1, the negative first gate clock −GCK1, the positive second gate clock +GCK2, the negative second gate clock −GCK2 and the negative second gate clock −GCK2 are respectively applied to the first gate line GL1, the third gate line GL3, the fifth gate line GL5, the second gate line GL2, the fourth gate line GL4 and the sixth gate line GL6 for testing the pixels in the array portion 200, the first to twelfth pixels 201, 202, . . . , 212 may have polarities substantially the same as the polarities of the first to twelfth pixels 201, 202, . . . , 212 of FIG. 6C.

Thus, in such an embodiment, the polarities of high sub pixels adjacent in the first direction D1 are different from each other, polarities of low sub pixels adjacent in the first direction D1 are different from each other, and polarities of a low sub pixel and a high sub pixel adjacent in the second direction D2 are different from each other.

Figure 8:
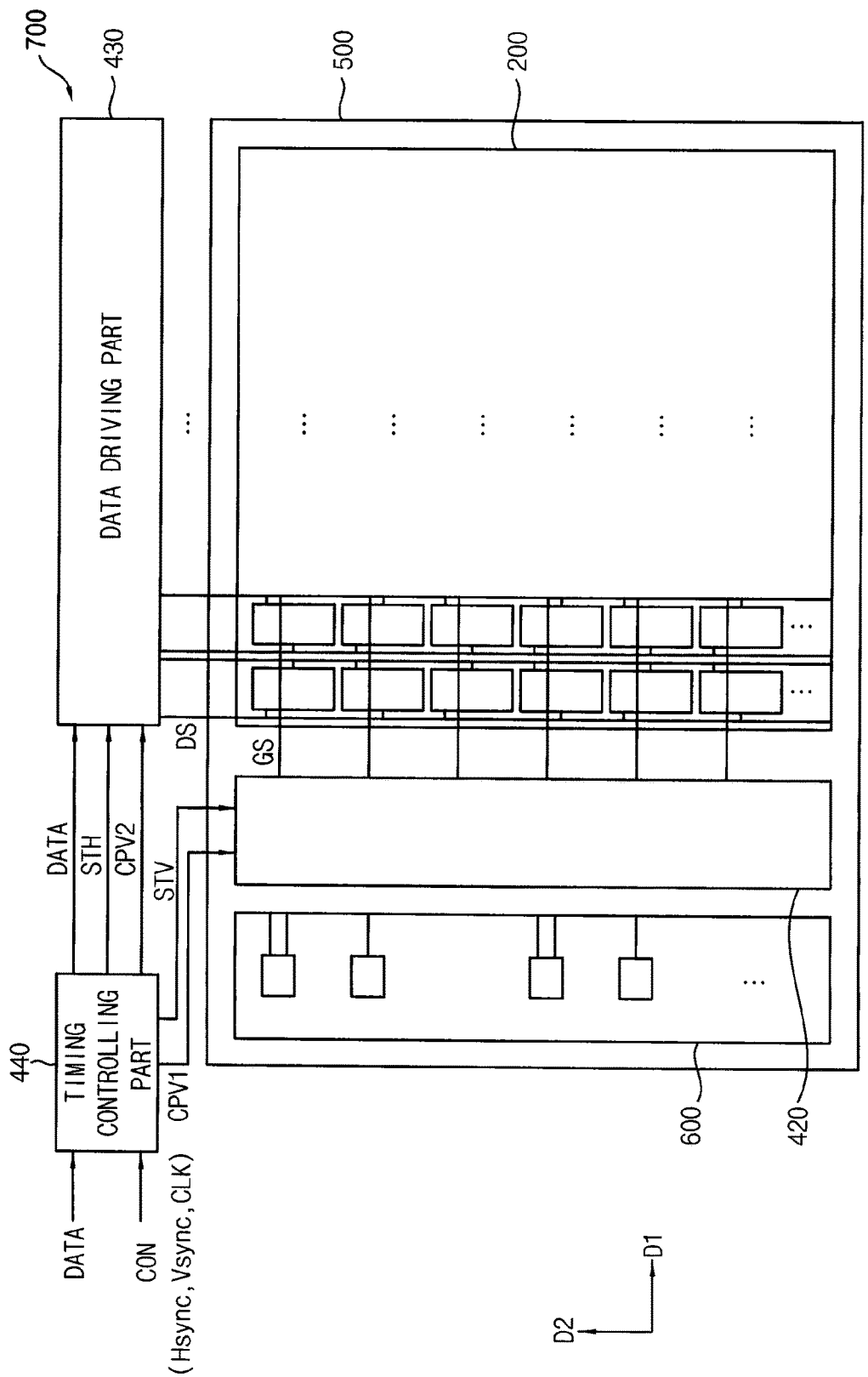
FIG. 8 is a block diagram illustrating an exemplary embodiment of a display apparatus including the display substrate of FIG. 7A.

FIG. 8 is a block diagram illustrating an exemplary embodiment of a display apparatus including the display substrate 500 of FIG. 7A.

The display apparatus 700 shown in FIG. 8 is substantially the same as the display apparatus 400 illustrated in FIG. 5 except for the display substrate 500. The same or like elements shown in FIG. 8 have been labeled with the same reference characters as used above to describe the exemplary embodiments of the display apparatus shown in FIG. 5 and any repetitive detailed description thereof will hereinafter be omitted or simplified.

Referring to FIG. 8, the display apparatus 700 includes the display substrate 500, the gate driving part 420, the data driving part 430 and the timing controlling part 440.

The display substrate 500 includes the array portion 200 and the pad portion 600 of FIG. 7A. In such an embodiment, as described above, the positive first gate clock +GCK1, the positive second gate clock +GCK2, the negative first gate clock −GCK1 and the negative second gate clock −GCK2, which are test signals for testing the pixels in the array portion 200, e.g., the first to twelfth pixels 201, 202, . . . , 212, may be applied to the array portion 200 through the pad portion 600. In such an embodiment, the pad portion 300 may be disconnected from the array portion 600 after performing the test.

According to an exemplary embodiment, as described above, when the positive first gate clock +GCK1, the positive second gate clock +GCK2, the negative first gate clock −GCK1 and the negative second gate clock −GCK2 are applied to the pixels in the array portion 200, the polarities of the high sub pixels adjacent in the first direction D1 are different from each other, the polarities of the low sub pixels adjacent in the first direction D1 are different from each other, and the polarities of the low sub pixel and the high sub pixel adjacent in the second direction D2 are different from each other, therefore, a short between the pixels 201, 202, . . . , 212 may be effectively detected based on detecting a point having the reference voltage in adjacent pixels. Thus, defect detection ratio of the display substrate 500 may be increased.

Figure 9A:
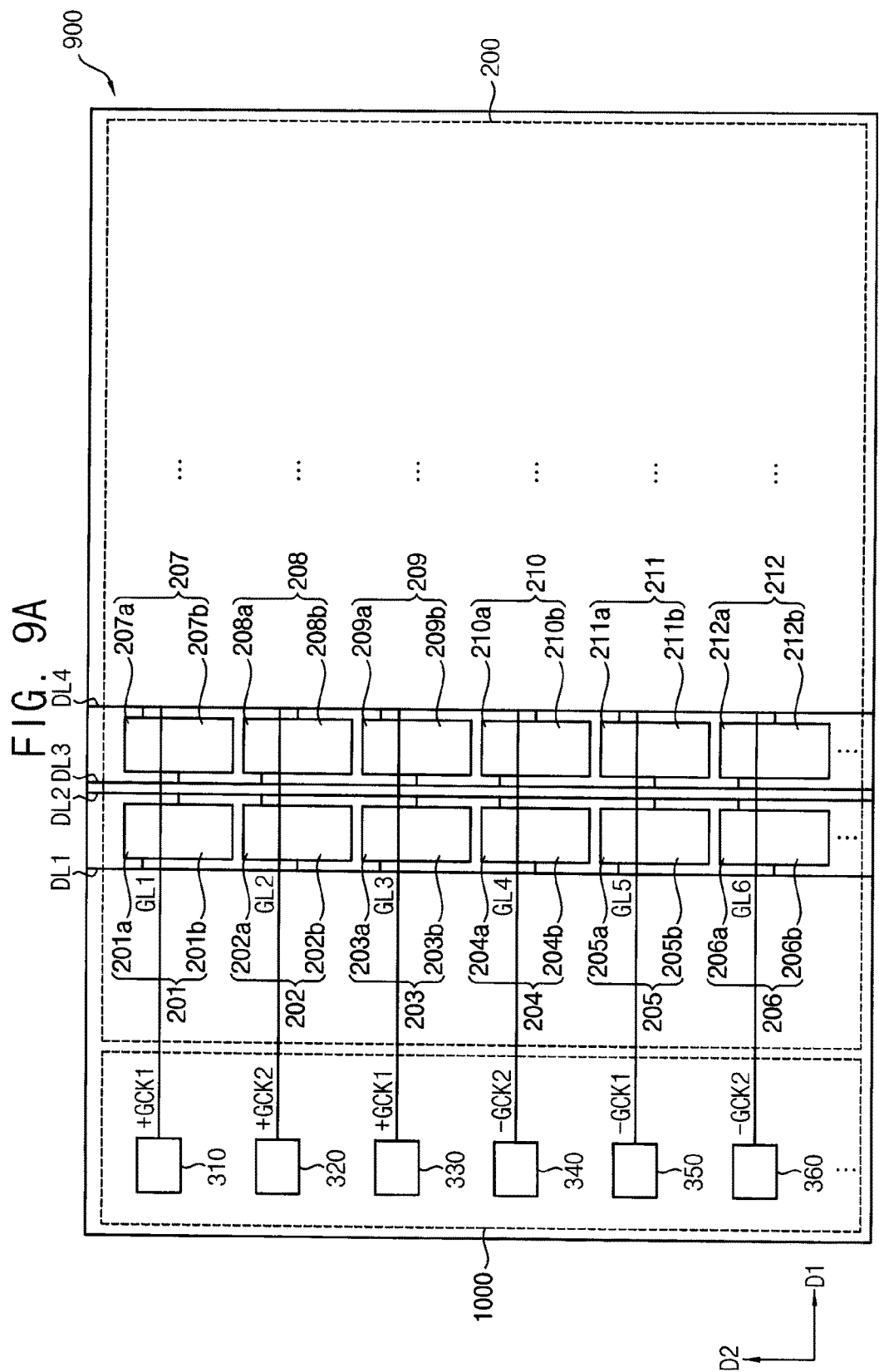
FIG. 9A is a plan view illustrating another alternative exemplary embodiment of a display substrate according to the invention.
Figure 9B:
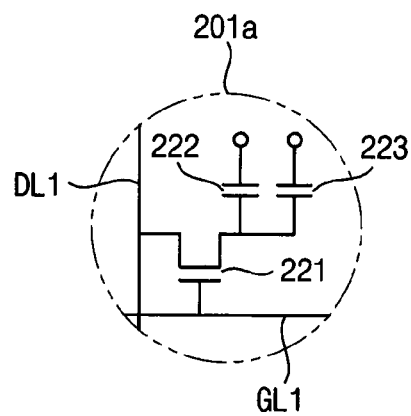
FIGS. 9B and 9C are circuit diagrams showing sub-pixels of a pixel of the display substrate shown in FIG. 9A.
Figure 9C:
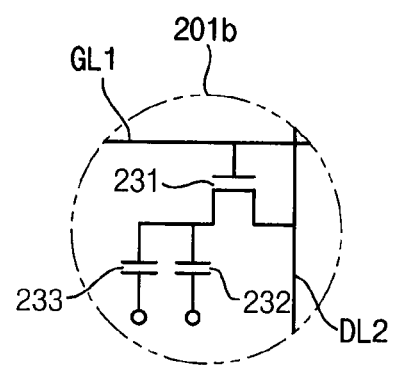

FIG. 9A is a plan view illustrating another alternative exemplary embodiment of a display substrate according to the invention, and FIGS. 9B and 9C are circuit diagrams showing sub-pixels of a pixel of the display substrate shown in FIG. 9A.

The display substrate 900 shown in FIGS. 9A to 9C is substantially the same as the display substrate 100 illustrated in FIGS. 1A to 1C except for a pad portion 1000. The same or like elements shown in FIGS. 9A to 9C have been labeled with the same reference characters as used above to describe the exemplary embodiments of the display substrate shown in FIGS. 1A to 1C, and any repetitive detailed description thereof will hereinafter be omitted or simplified.

The pad portion 1000 includes the first pad 310, the second pad 320, the third pad 330, the fourth pad 340, the fifth pad 350 and the sixth pad 360.

The first pad 310 outputs the positive first gate clock +GCK1 to the first gate line GL1. The first pad 310 may receive the positive first gate clock +GCK1 from the outside to output the positive first gate clock +GCK1 to the first gate line GL1.

The second pad 320 outputs the positive second gate clock +GCK2 to the second gate line GL2. The second pad 320 may receive the positive second gate clock +GCK2 from the outside to output the positive second gate clock +GCK2 to the second gate line GL2.

The third pad 330 outputs the positive first gate clock +GCK1 to the third gate line GL3. The third pad 330 may receive the positive first gate clock +GCK1 from the outside to output the positive first gate clock +GCK1 to the third gate line GL3.

The fourth pad 340 outputs the negative second gate clock −GCK2 to the fourth gate line GL4. The fourth pad 340 may receive the negative second gate clock −GCK2 from the outside to output the negative second gate clock −GCK2 to the fourth gate line GL4.

The fifth pad 350 outputs the negative first gate clock −GCK1 to the fifth gate line GL5. The fifth pad 350 may receive the negative first gate clock −GCK1 from the outside to output the negative first gate clock −GCK1 to the fifth gate line GL5.

The sixth pad 360 outputs the negative second gate clock −GCK2 to the sixth gate line GL6. The sixth pad 360 may receive the negative second gate clock −GCK2 from the outside to output the negative second gate clock −GCK2 to the sixth gate line GL6.

When the positive first gate clock +GCK1, the positive first gate clock +GCK1, the negative first gate clock −GCK1, the positive second gate clock +GCK2, the negative second gate clock −GCK2 and the negative second gate clock −GCK2 are respectively applied to the first gate line GL1, the third gate line GL3, the fifth gate line GL5, the second gate line GL2, the fourth gate line GL4 and the sixth gate line GL6 for testing the pixels in the array portion 200, the first to twelfth pixels 201, 202, . . . , 212 may have polarities substantially the same as the polarities of the first to twelfth pixels 201, 202, . . . , 212 of FIG. 3C.

Alternatively, when the positive first gate clock +GCK1, the positive first gate clock +GCK1, the negative first gate clock −GCK1, the positive second gate clock +GCK2, the negative second gate clock −GCK2 and the negative second gate clock −GCK2 are respectively applied to the first gate line GL1, the third gate line GL3, the fifth gate line GL5, the second gate line GL2, the fourth gate line GL4 and the sixth gate line GL6, the first to twelfth pixels 201, 202, . . . , 212 may have polarities substantially the same as the polarities of the first to twelfth pixels 201, 202, . . . , 212 of FIG. 6C.

Thus, the polarities of high sub pixels adjacent in the first direction D1 are different from each other, polarities of low sub pixels adjacent in the first direction D1 are different from each other, and polarities of a low sub pixel and a high sub pixel adjacent in the second direction D2 are different from each other.

Figure 10:
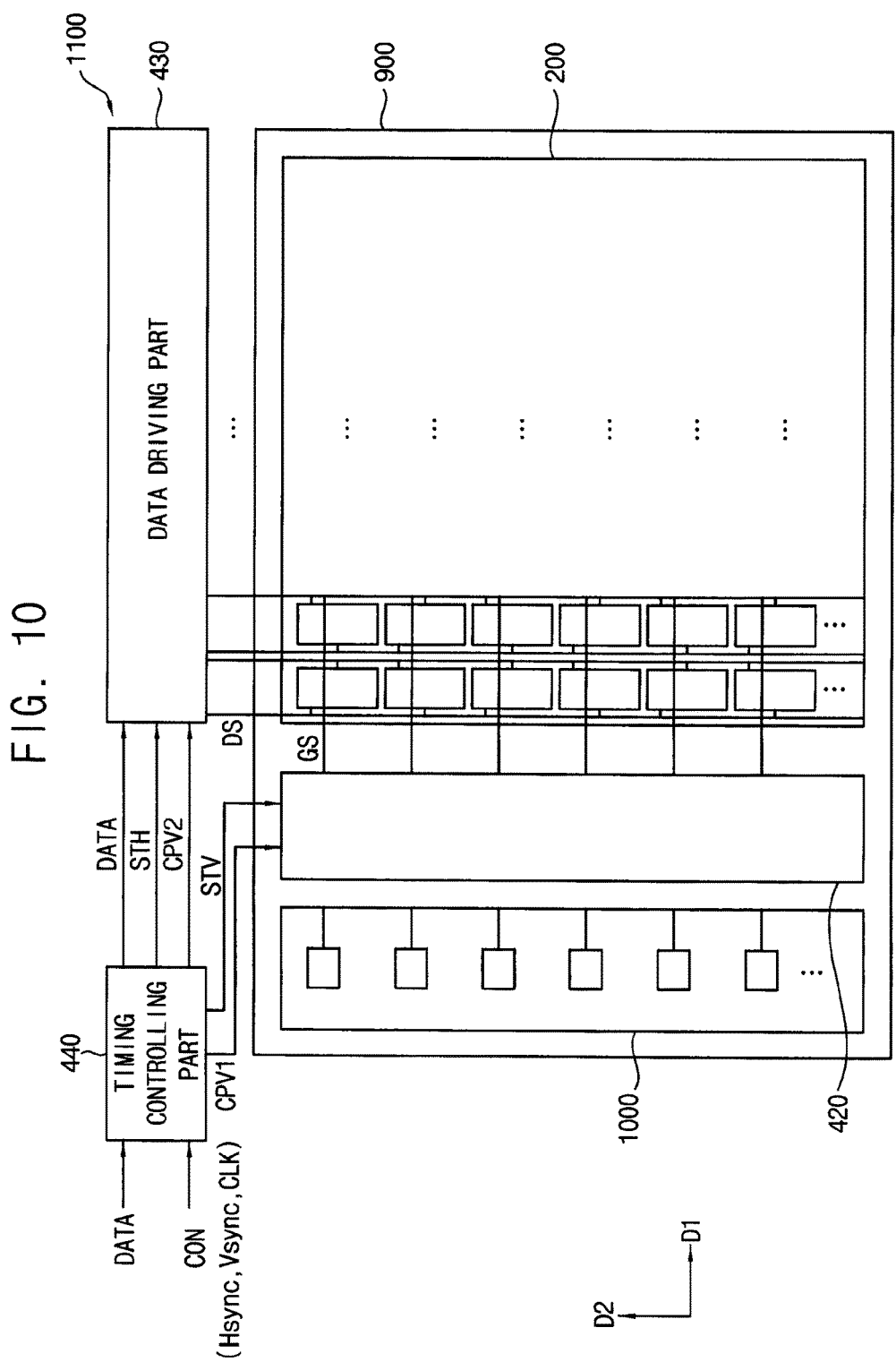
FIG. 10 is a block diagram illustrating an exemplary embodiment of a display apparatus including the display substrate of FIG. 9A.

FIG. 10 is a block diagram illustrating a display apparatus including the display substrate 900 of FIG. 9A.

The display apparatus 1100 shown in FIG. 10 is substantially the same as the display substrate 900 illustrated in FIG. 5. The same or like elements shown in FIG. 10 have been labeled with the same reference characters as used above to describe the exemplary embodiments of the display apparatus shown in FIG. 5 and any repetitive detailed description thereof will hereinafter be omitted or simplified.

Referring to FIG. 10, the display apparatus 1100 includes the display substrate 900, the gate driving part 420, the data driving part 430 and the timing controlling part 440.

The display substrate 900 includes the array portion 200 and the pad portion 1000 of FIG. 9A. In such an embodiment, as described above, the positive first gate clock +GCK1, the positive second gate clock +GCK2, the negative first gate clock −GCK1 and the negative second gate clock −GCK2, which are test signals for testing the pixels in the array portion 200, e.g., the first to twelfth pixels 201, 202, . . . , 212, may be applied to the array portion 200 through the pad portion 1000. In such an embodiment, the pad portion 300 may be disconnected from the array portion 1000 after performing the test.

According to an exemplary embodiment, as described above, when the positive first gate clock +GCK1, the positive second gate clock +GCK2, the negative first gate clock −GCK1 and the negative second gate clock −GCK2 are applied to the pixels in the array portion 200, the polarities of the high sub pixels adjacent in the first direction D1 are different from each other, the polarities of the low sub pixels adjacent in the first direction D1 are different from each other, and the polarities of the low sub pixel and the high sub pixel adjacent in the second direction D2 are different from each other, therefore, a short between the pixels 201, 202, . . . , 212 may be effectively detected based on detecting a point having the reference voltage in adjacent pixels. Thus, defect detection ratio of the display substrate 900 may be increased.

According to exemplary embodiments of the display substrate, the method of testing the display substrate and the display apparatus including the display substrate, as described herein, when the positive first gate clock +GCK1, the positive second gate clock +GCK2, the negative first gate clock −GCK1 and the negative second gate clock −GCK2 are applied to the pixels in the array portion of the display substrate, polarities of high sub pixels adjacent in a first direction are different from each other, polarities of low sub pixels adjacent in the first direction are different from each other, and polarities of the low sub pixel and the high sub pixel adjacent in the second direction are different from each other, therefore, a short between the pixels may be effectively detected based on detecting a point having the reference voltage in adjacent pixels. Thus, defect detection ratio of the display substrate may be increased.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
a first gate line configured to receive a first gate clock;
a second gate line adjacent to the first gate line and configured to receive a second gate clock;
a first data line configured to transfer a first data signal inverted according to the first gate clock and the second gate clock, wherein the first data signal has a first polarity;
a second data line configured to transfer a second data signal inverted according to the first gate clock and the second gate clock, wherein the second data signal has a second polarity different from the first polarity;
a first pixel comprising a first high sub pixel electrically and directly connected to the first gate line and the first data line, and a first low sub pixel electrically and directly connected to the first gate line and the second data line;
a second pixel comprising a second high sub pixel electrically and directly connected to the second gate line and the second data line, and a second low sub pixel electrically and directly connected to the second gate line and the first data line;

a first pad configured to output the first gate clock to the first gate line; and
a second pad configured to output the second gate clock to the second gate line.

2. The display substrate of claim 1, wherein
when the first pad outputs the first gate clock, the first data signal has a positive polarity and the second data signal has a negative polarity, and
when the second pad outputs the second gate clock, the first data signal has the negative polarity and the second data signal has the positive polarity.

3. The display substrate of claim 1, wherein
when the first pad outputs the first gate clock, the first data signal has a negative polarity and the second data signal has a positive polarity, and
when the second pad outputs the second gate clock, the first data signal has the positive polarity and the second data signal has the negative polarity.

4. The display substrate of claim 1, wherein the second gate clock is activated after the first gate clock is activated and deactivated.

5. The display substrate of claim 1, further comprising:
a third gate line adjacent to the second gate line and configured to receive the first gate clock; and
a third pixel comprising a third high sub pixel electrically connected to the third gate line and the first data line, and a third low sub pixel electrically connected to the third gate line and the second data line.

6. The display substrate of claim 5, further comprising:
a third pad configured to output the first gate clock to the third gate line.

7. The display substrate of claim 6, wherein the first pad and the third pad are electrically connected to each other.

8. The display substrate of claim 5, wherein the first pad is configured to further output the first gate clock to the third gate line.

9. The display substrate of claim 5, further comprising:
a fourth gate line adjacent to the third gate line and configured to receive the second gate clock;
a fourth pixel comprising a fourth high sub pixel electrically connected to the fourth gate line and the second data line, and a fourth low sub pixel electrically connected to the fourth gate line and the first data line; and
a fourth pad configured to output the second gate clock to the fourth gate line.

10. The display substrate of claim 9, wherein
the second gate clock comprises a positive second gate clock and a negative second gate clock,
the second pad is configured to output the positive second gate clock, and
the fourth pad is configured to output the negative second gate clock.

11. The display substrate of claim 9, further comprising:
a fifth gate line adjacent to the fourth gate line and configured to receive the first gate clock;
a fifth pixel comprising a fifth high sub pixel electrically connected to the fifth gate line and the first data line, and a fifth low sub pixel electrically connected to the fifth gate line and the second data line; and
a fifth pad configured to output the first gate clock to the fifth gate line.

12. The display substrate of claim 11, wherein
the first gate clock comprises a positive first gate clock and a negative first gate clock,
the first pad is configured to output the positive first gate clock, and
the fifth pad is configured to output the negative second gate clock.

13. The display substrate of claim 11, further comprising:
a sixth gate line adjacent to the fifth gate line and configured to receive the second gate clock; and
a sixth pixel comprising a sixth high sub pixel electrically connected to the sixth gate line and the second data line, and a sixth low sub pixel electrically connected to the sixth gate line and the first data line.

14. The display substrate of claim 13, further comprising:
a sixth pad configured to output the second gate clock to the sixth gate line.

15. The display substrate of claim 14, wherein the fourth pad and the sixth pad are electrically connected to each other.

16. The display substrate of claim 13, wherein the fourth pad is configured to further output the second gate clock to the sixth gate line.

17. A method of testing a display substrate, the method comprising:
applying a first gate clock to a first gate line of the display substrate,
wherein the display substrate comprises the first gate line configured to receive the first gate clock, a second gate line adjacent to the first gate line and configured to receive a second gate clock, a first data line configured to transfer a first data signal inverted according to the first gate clock and the second gate clock, a second data line configured to transfer a second data signal inverted according to the first gate clock and the second gate clock, a first pixel comprising a first high sub pixel electrically and directly connected to the first gate line and the first data line and a first low sub pixel electrically and directly connected to the first gate line and the second data line, and a second pixel comprising a second high sub pixel electrically and directly connected to the second gate line and the second data line and a second low sub pixel electrically and directly connected to the second gate line and the first data line, the first data signal having a first polarity, the second data signal having a second polarity different from the first polarity;
applying the first data signal and the second data signal to the first data line and the second data line, respectively;
applying the second gate clock to the second gate line;
applying the first data signal and the second data signal to the first data line and the second data line, respectively; and
determining whether the first pixel and the second pixel are short.

18. The method of claim 17, wherein the first gate clock comprises a positive first gate clock and a negative first gate clock.

19. The method of claim 17, wherein the second gate clock comprises a positive second gate clock and a negative second gate clock.

20. A display apparatus comprising:
a display substrate comprising:
a first gate line configured to receive a first gate clock;
a second gate line adjacent to the first gate line and configured to receive a second gate clock;
a first data line configured to transfer a first data signal inverted according to the first gate clock and the second gate clock;
a second data line configured to transfer a second data signal inverted according to the first gate clock and the second gate clock;

a first pixel comprising a first high sub pixel electrically and directly connected to the first gate line and the first data line, and a first low sub pixel electrically and directly connected to the first gate line and the second data line;

a second pixel comprising a second high sub pixel electrically and directly connected to the second gate line, and the second data line and a second low sub pixel electrically and directly connected to the second gate line and the first data line;

a first pad configured to output the first gate clock to the first gate line; and a second pad configured to output the second gate clock to the second gate line, wherein the first data signal has a first polarity, and the second data signal has a second polarity different from the first polarity;

a gate driving part configured to output gate signals to the first gate line and the second gate line; and a data driving part configured to output the first data signal and the second data signal to the first data line and the second data line, respectively.

* * * * *